United States Patent
Kawasaki

(10) Patent No.: US 8,130,314 B2
(45) Date of Patent: Mar. 6, 2012

(54) SOLID-STATE IMAGE CAPTURING APPARATUS, MOUNTING METHOD OF SOLID-STATE IMAGE CAPTURING APPARATUS, MANUFACTURING METHOD OF SOLID-STATE IMAGE CAPTURING APPARATUS, AND ELECTRONIC INFORMATION DEVICE

(75) Inventor: Takayuki Kawasaki, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 610 days.

(21) Appl. No.: 12/319,875

(22) Filed: Jan. 13, 2009

(65) Prior Publication Data
US 2009/0190009 A1    Jul. 30, 2009

(30) Foreign Application Priority Data
Jan. 28, 2008   (JP) ................. 2008-016577

(51) Int. Cl.
*H04N 5/225* (2006.01)
*H04N 5/335* (2011.01)
*H01L 21/00* (2006.01)
*H01L 23/02* (2006.01)

(52) U.S. Cl. ........... 348/374; 348/294; 438/69; 257/680

(58) Field of Classification Search ............ 348/294, 348/311, 374, E5.091; 438/69, 75; 257/431, 257/432, 433, 680
See application file for complete search history.

(56) References Cited

FOREIGN PATENT DOCUMENTS

| JP | 04-223371 | | 8/1992 |
| JP | 04-250665 | | 9/1992 |
| JP | 05013738 A | * | 1/1993 |

* cited by examiner

*Primary Examiner* — William Choi
(74) *Attorney, Agent, or Firm* — Edwards Wildman Palmer LLP; David G. Conlin; Edmund Koundakjian

(57) ABSTRACT

A solid-state image capturing apparatus includes: an insulation substrate including an external lead terminal; a solid-state image capturing element fixed on the insulation substrate and including a microlens; and a transparent glass member positioned above the insulation substrate for sealing the solid-state image capturing element fixed on the insulation substrate, and an electrode of the solid-state image capturing element and the external lead terminal of the insulation substrate being connected by a wire, wherein the transparent glass member is positioned in such a manner that a hollow space is formed between a microlens of the solid-state image capturing element and the transparent glass member, and wherein portions of the insulation film, the solid-state image capturing element and the wire, which are exposed in the hollow space, are all covered with a protective film.

20 Claims, 14 Drawing Sheets

(a)

(b)

(a)

(b)

(a)

(b)

(a)

(b)

(a)

(b)

(a)

(b)

(c)

(d)

(e)

--Prior Art--

(a)

(b)

--Prior Art--

SOLID-STATE IMAGE CAPTURING APPARATUS, MOUNTING METHOD OF SOLID-STATE IMAGE CAPTURING APPARATUS, MANUFACTURING METHOD OF SOLID-STATE IMAGE CAPTURING APPARATUS, AND ELECTRONIC INFORMATION DEVICE

This nonprovisional application claims priority under 35 U.S.C. §119(a) to Patent Application No. 2008-016577 filed in Japan on Jan. 28, 2008, the entire contents of which are hereby incorporated by reference.

BACKGROUND OF THE INVENTION

1. Field of the Invention

The present invention is related to a solid-state image capturing apparatus, an mounting method for the solid-state image capturing apparatus, a manufacturing method for the solid-state image capturing apparatus, and an electronic information device, and more particularly, to an element structure for improving the moisture resistance of a solid-state image capturing apparatus including a chip of a solid-state image capturing element (also referred to as an image capturing element chip, hereinafter) housed in an element sealing package; a method for mounting the solid-state image capturing element in such a manner to have the element structure; a method for manufacturing a solid-state image capturing apparatus that has the element structure, and an electronic information device including the solid-state image capturing apparatus that has the element structure.

2. Description of the Related Art

Conventionally, various kinds of structures with an improved moisture resistance exist as a mounting structure of a solid-state image capturing element.

FIG. 12 illustrates a solid-state image capturing apparatus having a mounting structure where a solid-state image capturing chip is sealed with resin on a ceramic substrate (see Reference 1), as an example of a conventional solid-state image capturing apparatus.

A solid-state image capturing apparatus 50 illustrated in FIG. 12 includes a ceramic substrate 51 having an external lead terminal formed on a back surface side. A solid-state image capturing element chip 52 is fixed on the ceramic substrate 51 with an adhesive, and an electrode of the image capturing element chip 52 and an electrode portion of the ceramic substrate 51 are connected to each other by a bonding wire 56. In addition, a color filter 53 is adhered on a surface of the image capturing element chip 52 with a transparent adhesive 54. In addition, exposed surfaces of the ceramic substrate 51, image capturing element chip 52, color filter 53, and bonding wire 56 are covered with a moisture-resistant silicon nitride film 55. Further, an upper surface of the ceramic substrate 51 is sealed with a sealing resin 57 in such a manner to expose a light incident surface of the color filter 53, and the image capturing element chip 52, color filter 53, and bonding wire 56 are embedded in the sealing resin 57.

Next, a mounting method will be described.

First, the image capturing element chip 52 is adhered to the ceramic substrate 51 that includes an exterior lead terminal 58; and an internal electrode (electrode pad) of the image capturing element chip 52 and the electrode portion of the ceramic substrate 51 are connected with the bonding wire 56.

Next, the color filter 53 formed with an organic material is adhered to a surface of the image capturing element chip 52 with the transparent adhesive 54.

Subsequently, the ceramic substrate 51 equipped with the image capturing element chip 52 and the color filter 53, is positioned in a plasma CVD apparatus to form a plasma silicon nitride film 55 of 400 to 500 nm on an entire surface thereof.

Further, the solid-state image capturing element chip 52 and the color filter 53 of the ceramic substrate 51 are sealed with a resin 57, and subsequently, the silicon nitride film 55 formed on an unnecessary portion of a light incident surface (upper surface) of the color filter 53, the external lead terminal 58 and the like, is removed by etching.

According to the solid-state image capturing apparatus having the mounting structure described above, an interface portion of a side surface of the solid-state image capturing chip and a side surface of the color filter, which is a infiltration path for moisture, is entirely covered with a moisture-resistant insulation film to prevent moisture from entering from the transparent adhesive portion of the interface. As a result, the solid-state image capturing apparatus prevents moisture from infiltrating into the transparent adhesive 54, which is the interface of the color filter 53 and the image capturing element chip 52, thereby preventing the deterioration (fading) of the color filter, which is composed of an organic material, and the deterioration, such as corrosion, of the image capturing element chip itself.

Among the solid-state image capturing elements in recent years, the number of pixels in the elements steadily increases. In addition, it has become a common technique to form a color filter, and further, a microlens for focusing light on the solid-state image capturing element for the purpose of compensating a decreased light receiving area per pixel.

However, the color filter is adhered on the solid-state image capturing element chip according to the mounting structure of the conventional solid-state image capturing apparatus 50 illustrated in FIG. 12. As a result, the microlens cannot be formed on the surface of the solid-state image capturing element chip, and the area for receiving light is limited only to the portion where a light shielding film is open in the solid-state image capturing element chip, resulting in a significant decrease of the sensitivity for the recent fine pixels.

For this reason, a mounting structure to seal the image capturing element chip with a sealing package and a lid glass is applied for recent image capturing element chips with a microlens, as illustrated in FIG. 13(a).

A solid-state image capturing apparatus 70 illustrated in FIG. 13(a) includes a sealing package 71 that includes an external lead terminal 77. An image capturing element chip 72 is fixed on a bottom surface inside the sealing package 71 with an adhesive 75a, and an electrode of the image capturing element chip 72 and an electrode portion of the sealing package 71 are connected to each other with a bonding wire 73.

Subsequently, a microlens 78 is formed on a surface of the image capturing element chip 72 in a corresponding manner to each pixel, and a reflection preventing film 74 is formed on the microlens 78. In addition, the sealing package 71 described above includes a package substrate 71a and an external wall portion 71b formed in the periphery of the package substrate 71a. The sealing package 71 is formed with a mold resin and ceramic.

A lid glass 76 is adhered on the external wall portion 71b, and the image capturing element chip 72 described above is sealed by the lid glass 76 and the sealing package 71 described above. In addition, a hollow space is formed between the lid glass 76 and the microlens of the image capturing element chip.

Hereinafter, a method will be described for mounting the image capturing element chip described above on a package.

First, an image capturing element wafer W2, which is formed in a former half wafer process, is cut for each image capturing element chip 72 (die), and each image capturing element chip (only the ones with good quality) is taken out (FIG. 14(a)). At this stage, a resist for protecting a surface is formed only on an image capturing area of the image capturing element chip. That is, no resist remains on an electrode pad of the image capturing element chip.

Next, a package 71 without a die mounted thereon is mounted on each mounting portion Car of a sealing process (latter half process) flowing carrier Ca (FIG. 14(b)). Herein, the flowing carrier Ca is formed to be capable of mounting 5 to 10 of the sealing packages 71 described above. Further, the sealing package 71 includes the external lead terminal 77 and the package substrate (package body) 71 as described above. A lid member for pressing and fixing the package is denoted as Ca1 in the figure.

After a model name, manufacturer name and the like are printed on a back surface of the package body (FIG. 14(c)), the image capturing element chip (die) 72 is adhered to the package 71 with the adhesive 75a (FIG. 14(d)).

Subsequently, an electrode terminal of the image capturing element chip 72 and the external lead terminal 77 are connected to each other with a gold wire 73 (FIG. 14(e)). Further, after the removal of a resist 72a for protecting the element surface (FIG. 14(f)), a UV cured resin 75b (also referred to as glass seal) is applied on an upper surface of the external wall portion 71b of the package. After the lid glass 76 is mounted on the surface of the package, the UV cured resin 75b is cured using UV radiation and the lid glass 76 is adhered on the surface of the package (FIG. 14(g)).

The element sealing method described above is an extremely ordinary method for sealing an image capturing element chip with a microlens. However, such solid-state image capturing apparatus that is sealed by the method is not sufficient for a countermeasure to prevent moisture from infiltrating and the like from the outside of the package.

That is, although it is possible to prevent a physical damage or a direct contact with moisture from the outside into the image capturing element chip by the lid glass 76 of the surface of the package and the glass seal 75b for adhering the external wall of the package and the lid glass, it is not possible to completely prevent moisture from infiltrating from the glass seal portion, which is an adhesive. In such a case, an impurity contained in the moisture or even a glass seal component is mixed with the infiltrating moisture, resulting in corrosion of metal wirings in the image capturing element chip and an occurrence of other malfunction that leads to impairing the reliability.

It is conceivable that these undesirable matters are caused because the hollow space is provided above the image capturing element chip (above the microlens). However, the following reasons are listed for the reason why the hollow space is provided above the image capturing element chip (i.e., the entire space inside the package), instead of filling it with a resin or the like.

FIG. 13(b) is a diagram illustrating a diagrammatic cross sectional structure of a pixel portion in a solid-state image capturing element (e.g., CCD image capturing element).

A silicon substrate 81, which configures the solid-state image capturing element chip 72, illustrated in FIG. 13(b) includes a photodiode 82 formed in a predetermined area, for performing a photoelectric conversion that corresponds to each pixel. In addition, a gate electrode 83 formed of a polysilicon film is formed on both sides of the photodiode 82 above the silicon substrate 81, with a gate insulation film interposed therebetween. The gate electrode is covered by a light shielding film 84. Further, color filters 87a and 87b are positioned on the silicon substrate 81 and the gate electrode 83 with a first interlayer insulation film interposed therebetween (planarizing film) 85a. Further, a microlens 86 is positioned on the color filter with the second interlayer insulation film (planarizing film) 85b interposed therebetween.

Next, a manufacturing method will be described for the image capturing element chip 72. Herein, the color filter 87a is a green color filter, and the color filter 87b is either a red or blue color filter.

First, the photodiode 82 for converting a received light into an electric charge is formed by an impurity ion planting with phosphorus or the like in an area corresponding to each pixel of the silicon substrate 81. Subsequently, the gate electrode 83 for reading out and transferring an electric charge from the photodiode is formed with a polysilicon film and the like. Subsequently, a light shielding film 84, which is for preventing light from entering an area other than the photodiode of the surface of the substrate (e.g., electric charge transferring section), is formed with a high melting point metal material, such as tungsten. Subsequently, the first planarizing film 85a for planarizing an element is formed on the entire surface with one of a silicon oxide film, a silicon nitride film and a transparent organic material, or the combination thereof.

Subsequently, each of the color filters of the respective colors is formed on the first planarizing film 85a. For example, a green color filter is first formed in an odd numbered pixel of an odd pixel row and in an even numbered pixel of an even pixel row. Next, a red color filter is formed in an even numbered pixel of an odd pixel row; and a blue color filter is formed in an odd numbered pixel of an even pixel row.

After the second planarizing film 85b is formed, the microlens 86 is formed thereon with a transparent organic film (e.g., acrylic).

Herein, it is about 3 µm to 5 µm in thickness from the surface of the silicon substrate 81 to the surface of the second planarizing film. In addition, with regard to the thickness of the color films, the green color filter is about 0.4 to 0.5 µm, each of the red and blue color filters is about 0.5 to 0.8 µm in thickness. The microlens is about 0.4 µm to 2 µm in thickness.

Note that color filters of complementary colors may be used as well, instead of the above-described color filters of primary colors such as green, red and blue.

More specifically, complementary colors, such as Cy (cyan), Mg (magenta), Ye (yellow) and Gr (green), are used for the complementary color filters. However, a Gr color filter in this case will be formed by overlapping a Cy color filter and a Ye color filter, and therefore, the color filters to be formed during the process are only the three color filters of Cy, Mg and Ye. In addition, the Ye color filter is 0.5 µm in thickness; the Mg color filter is 0.9 µm in thickness; and the Gr color filter (Cy color filter and Ye color filter) is 1.0 µm in thickness. The Cy color filter (single layer portion) is 1.0 µm in thickness.

The role of the microlens 86 is to effectively lead the light that enters the microlens into the photodiode (opening portion of the light shielding film). In that case, the relationship of the microlens and the refractive index of the above portion is extremely important. The refractive index of an acrylic material, which is an ordinary organic material, is 1.60; and the refractive index of the hollow space (air) thereabove is 1.0. Incident light is refracted and focused towards the photodiode because of the difference of the refractive indexes and the shape of the microlens. For example, if a resin or the like fills the space above the microlens, the refractive index will be about 1.60 there, which is hardly different from the refractive index of the microlens. As a result, the incident light will not be focused on the photodiode no matter what kind of shape is made for the microlens.

Therefore, for example, a similar light focusing effect can be obtained by forming the entire microlens with a silicon nitride film (refractive index of 2.0) and filling the above portion with a resin (refractive index of about 1.60). However, this method is not adopted currently because the light focusing effect obtained is the same as before despite of the difficulty in forming the element.

In addition, Reference 2 also discloses a solid-state image capturing apparatus with the mounting structure illustrated in FIG. 13.

Reference 1: Japanese Laid-Open Publication No. 4-250665

Reference 2: Japanese Laid-Open Publication No. 4-223371

SUMMARY OF THE INVENTION

Due to the reasons described above, the conventional solid-state image capturing element with a microlens includes a hollow (air) area above an element, which permits the infiltration of moisture from the glass seal portion.

Further, the film 74, which is above the microlens in the conventional image capturing element chip illustrated in FIG. 13, is a reflection preventing film for preventing incident light from being reflected. When light enters from air into acrylic (microlens), it means that the incident light passes from air with refractive index of 1.0 into the acrylic (microlens) with refractive index of 1.60. In general, the reflection of the light becomes smaller as the difference of the refractive indexes becomes smaller between a plurality of films through which the light passes. Therefore, the reflection of the light can be reduced small by inserting a silicon oxide film and the like with refractive index of 1.45 in between the air with refractive index of 1.0 and the acrylic with refractive index of 1.60.

The reflection preventing film 74 above the microlens herein is formed for the purpose of preventing the reflection of the incident light. Therefore, the reflection preventing film 74 is removed from a portion that is not related to the entering of light, such as an electrode pad portion and the like where a connection with a gold wire is required later.

Therefore, due to the infiltration of moisture into the glass seal portion, an exposed portion where the reflection preventing film 74 is removed, such as a connecting portion of the gold wire and the electrode pad, tends to cause corrosion of a metal member and an occurrence of other malfunction that leads to impairing the reliability.

The present invention is intended to solve the conventional problems described above. The objective of the present invention is to provide a solid-state image capturing apparatus, which does not cause corrosion and the like of an element wiring even if moisture infiltrates inside a sealing package and achieves an element with a high reliability, a manufacturing method for the solid-state image capturing apparatus, a mounting method for the solid-state image capturing apparatus, and an electronic information device.

A solid-state image capturing apparatus according to the present invention includes: an insulation substrate including an external lead terminal; a solid-state image capturing element fixed on the insulation substrate and including a microlens; and a transparent glass member positioned above the insulation substrate for sealing the solid-state image capturing element fixed on the insulation substrate, and an electrode of the solid-state image capturing element and the external lead terminal of the insulation substrate being connected by a wire, wherein the transparent glass member is positioned in such a manner that a hollow space is formed between a microlens of the solid-state image capturing element and the transparent glass member, and wherein portions of the insulation film, the solid-state image capturing element and the wire, which are exposed in the hollow space, are all covered with a protective film, thereby achieving the objective described above.

Preferably, in a solid-state image capturing apparatus according to the present invention, a refractive index of the protective film is smaller than a refractive index of a constituent material of the microlens and larger than a refractive index of air.

Still preferably, in a solid-state image capturing apparatus according to the present invention, the protective film is one of a $SiO_2$ film, a SiON film and a SiN film.

Still preferably, in a solid-state image capturing apparatus according to the present invention, the protective film includes a multilayer structure where a plurality of transparent insulation films with different refractive indexes are laminated in such a manner that one with a smaller refractive index is positioned on a surface side.

Still preferably, in a solid-state image capturing apparatus according to the present invention, the protective film includes a two layered structure where two transparent insulation films with different refractive indexes are laminated in such a manner that one with a smaller refractive index is positioned on a surface side, and the transparent insulation film constituting the protective film on an outer side is a $SiO_2$ film and the transparent insulation film constituting the protective film on an inner side is a SiN film.

Still preferably, in a solid-state image capturing apparatus according to the present invention, the protective film includes a two layered structure where two transparent insulation films with different refractive indexes are laminated in such a manner that one with a smaller refractive index is positioned on a surface side, and the transparent insulation film constituting the protective film on an outer side is a SiON film and the transparent insulation film constituting the protective film on an inner side is a SiN film.

Still preferably, in a solid-state image capturing apparatus according to the present invention, the protective film includes a two layered structure where two transparent insulation films with different refractive indexes are laminated in such a manner that one with a smaller refractive index is positioned on a surface side, and the transparent insulation film constituting the protective film on an outer side is a $SiO_2$ film and the transparent insulation film constituting the protective film on an inner side is a SiON film.

Still preferably, in a solid-state image capturing apparatus according to the present invention, the protective film includes a three layered structure where three transparent insulation films with different refractive indexes are laminated in such a manner that one with a smaller refractive index is positioned on a surface side, and the transparent insulation film constituting the protective film on an outer side is a $SiO_2$ film, the transparent insulation film constituting the protective film on an inner side is a SiN film, and the transparent insulation film constituting the protective film in a middle portion is a SiON film.

Still preferably, in a solid-state image capturing apparatus according to the present invention, the protective film has a refractive index that is successively changed to be smaller towards a surface side.

Still preferably, in a solid-state image capturing apparatus according to the present invention, the protective film includes a SiON film in which a ratio of oxygen and nitrogen is successively changed in such a manner that the refractive index becomes smaller towards the surface side.

Still preferably, in a solid-state image capturing apparatus according to the present invention, the protective film is formed by a plasma CVD method.

A mounting method of a solid-state image capturing apparatus according to the present invention, for mounting a solid-state image capturing element including a microlens on an insulation substrate including an external lead terminal, includes: a step of fixing the solid-state image capturing element on the insulation substrate; a step of connecting an external lead terminal of the insulation substrate and an electrode of the solid-state image capturing element with a wire; a step of forming a protective film on a surface of the insulation substrate in such a manner that exposed portions of the insulation substrate, the solid-state image capturing element and the wire are all covered with the protective film; and a step of positioning a transparent glass member on the insulation substrate to seal the solid-state image capturing element in such a manner to form a hollow space between a microlens of the solid-state image capturing element and the transparent glass member, thereby achieving the objective described above.

Preferably, in a mounting method of a solid-state image capturing apparatus according to the present invention, the protective film is formed by a plasma CVD process prior to sealing the solid-state image capturing element with the transparent glass member.

Still preferably, in a mounting method of a solid-state image capturing apparatus according to the present invention, in the step of forming the protective film, at least the solid-state image capturing element is housed in a jig that totally covers a side surface and a bottom surface of the solid-state image capturing element to perform the plasma CVD process.

Still preferably, in a mounting method of a solid-state image capturing apparatus according to the present invention, the plasma CVD process is performed at least in two steps by changing an inclination of the jig so that a difference remains small between a thickness of the protective film formed on a surface side of the wire and a thickness of the protective film formed on a back side of the wire.

Still preferably, in a mounting method of a solid-state image capturing apparatus according to the present invention, in the plasma CVD process, tetraethy orthosilicate or ethyl ethoxy silane and $O_2$ are used as a reaction gas, and a $SiO_2$ film is formed as the protective film.

Still preferably, in a mounting method of a solid-state image capturing apparatus according to the present invention, in the plasma CVD process, $SiH_4$, $NH_3$ and $N_2$ are used as a reaction gas, and a SiN film is formed as the protective film.

Still preferably, in a mounting method of a solid-state image capturing apparatus according to the present invention, in the plasma CVD process, $SiH_4$, $N_2O$ and He are used as a reaction gas, and a SiON film is formed as the protective film.

Still preferably, in a mounting method of a solid-state image capturing apparatus according to the present invention, in the step of forming the protective film, the plasma CVD process is performed several times by changing a component of a reaction gas so that the protective film includes a multilayer structure that includes a plurality of transparent insulation films with different refractive indexes.

Still preferably, in a mounting method of a solid-state image capturing apparatus according to the present invention, in the step of forming the protective film, the plasma CVD process is performed by successively changing a component of a reaction gas so that a transparent insulation film with a successively changing refractive index is formed as the protective film.

A manufacturing method of a solid-state image capturing apparatus according to the present invention in which a solid-state image capturing element including a microlens is mounted on an insulation film including an external lead terminal and a transparent glass member is positioned above the insulation substrate so that the solid-state image capturing element fixed on the insulation substrate is sealed, includes: a step of fixing the solid-state image capturing element on the insulation substrate; a step of connecting an external lead terminal of the insulation substrate and an electrode of the solid-state image capturing element with a wire; a step of forming a protective film on a surface of the insulation substrate in such a manner that exposed portions of the insulation substrate, the solid-state image capturing element and the wire are all covered with the protective film; and a step of positioning a transparent glass member on the insulation substrate to seal the solid-state image capturing element in such a manner to form a hollow space between a microlens of the solid-state image capturing element and the transparent glass member, thereby achieving the objective described above.

An electronic information device according to the present invention includes an image capturing section for capturing an image of a subject, where the image capturing section is a solid-state image capturing apparatus according to the present invention, thereby achieving the objective described above.

The functions of the present invention will be described hereinafter.

According to the present invention, a solid-state image capturing element is adhered to an insulation substrate, namely a sealing package, and a wire bonding is performed, and subsequently, a protective film is formed by CVD and the like, the protective film being for covering a surface of the solid-state image capturing element and wire that is exposed inside the sealing package. Subsequently, a lid glass is adhered to the surface of the sealing package to seal the solid-state image capturing element. As a result, all the surface of the element and the wire inside the package are covered with the protective film, and corrosion at the exposed portion of the wiring and separation of bonding and the like can be prevented from occurring even when moisture and the like infiltrates the sealed portion between the sealing package and the glass.

In addition, the protective film described above is configured of a multilayer structure laminated with a transparent insulation film with a different refractive index, the reflection of an incident light can be reduced at the surface of the protective film while the moisture resistance can be increased.

In addition, according to the present invention, a jig for housing the sealing package is used in laminating the protective film described above, and the CVD process is performed by changing the angle of the jig. As a result, the protective film can be prevented from being laminated too thin at a portion under a wire and the like of the exposed surface of the sealing package and the solid-state image capturing element.

According to the present invention as described above, all the surfaces of the image capturing element chip and wire exposing inside the sealing package are covered with the protective film. Therefore, no corrosion or the like of the element wire occurs and an element with high reliability can be achieved even if moisture infiltrates inside the sealing package.

These and other advantages of the present invention will become apparent to those skilled in the art upon reading and understanding the following detailed description with reference to the accompanying figures.

BRIEF DESCRIPTION OF THE DRAWINGS

FIG. 1(a) is a diagram illustrating a cross sectional structure of the solid-state image capturing apparatus. FIGS. 1(b) and 1(c) are enlarged views illustrating a microlens and a protective film thereabove.

FIGS. 3(a) and 3(b) are a top view and a side view respectively, illustrating a structure of an image capturing element chip at a step illustrated in FIG. 2(g).

FIG. 4(a) is a diagram illustrating a plan structure of an electrode pad portion. FIG. 4(b) is a diagram illustrating a cross sectional structure along a line A-A' in FIG. 4(a).

FIG. 5(a) is a perspective view. FIG. 5(b) is a cross sectional view.

FIG. 7(a) is a diagram illustrating a structure of a CVD jig used in the exemplary variation. FIG. 7(b) is a diagram illustrating a detail of a Y portion.

FIG. 8(a) is a diagram illustrating a structure of a CVD jig used in the exemplary variation. FIG. 8(b) is a diagram illustrating a detail of a Y portion.

FIG. 9(a) is a diagram illustrating a cross sectional structure of the solid-state image capturing apparatus. FIGS. 9(b) is an enlarged view illustrating a microlens and a protective film thereabove. Further, FIGS. 9(c) to 9(e) are diagrams illustrating an exemplary variation of Embodiment 2.

FIG. 10(a) is a diagram illustrating a cross sectional structure of the solid-state image capturing apparatus. FIG. 10(b) is an enlarged view illustrating a microlens and a protective film thereabove.

FIG. 13(a) is a diagram illustrating another mounting structure where an image capturing chip is sealed with resin on a ceramic substrate. FIG. 13(b) is a diagram illustrating the image capturing chip.

Figure 1:
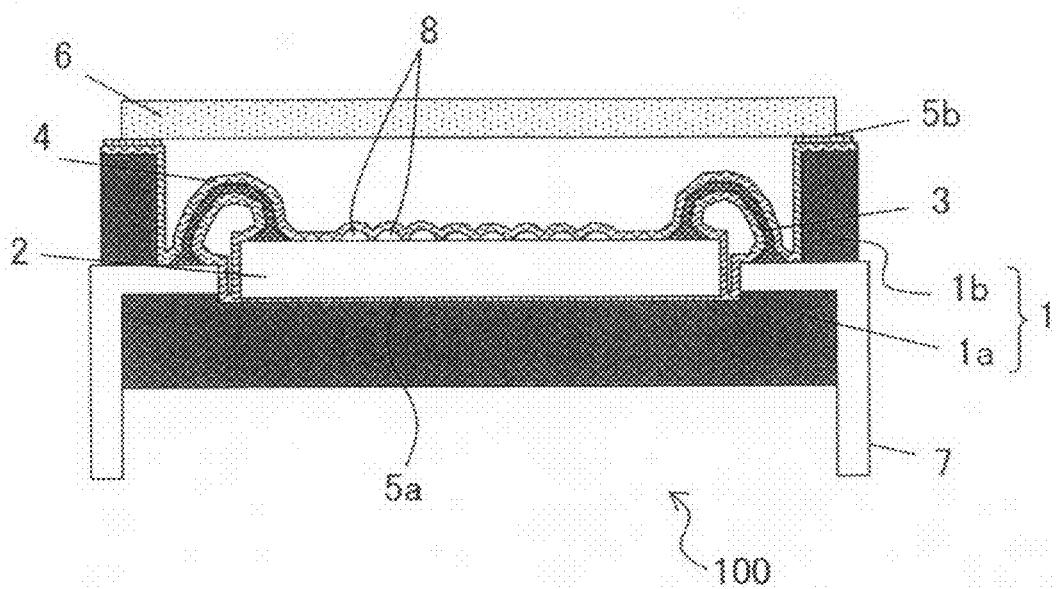
FIG. 1 is a diagram illustrating a structure of a solid-state image capturing apparatus according to Embodiment 1 of the present invention.
Figure 1:
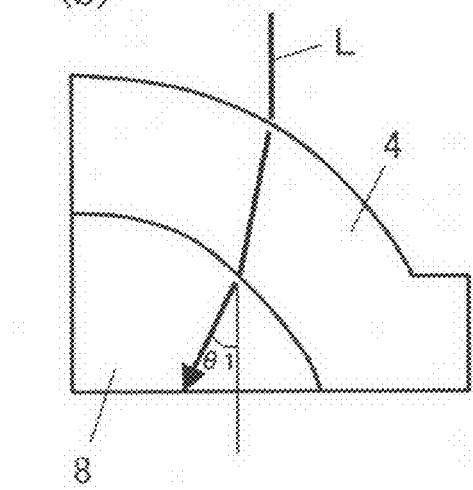
Figure 1:
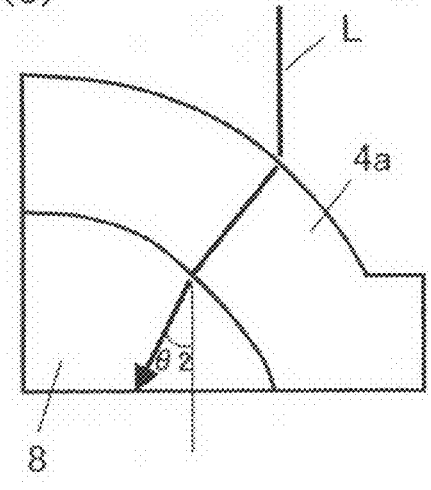

1 sealing package
1a package substrate
1b external wall portion
2 image capturing element chip (solid-state image capturing element)
3 bonding wire
4, 4a to 4f protective film
5a adhesive
5b glass seal
6 lid glass
7 external lead terminal
8 microlens
100, 100a, 100b solid-state image capturing apparatus
120 protective film forming jig
130 CVD apparatus

DESCRIPTION OF THE PREFERRED EMBODIMENTS

Hereinafter, embodiments of the present invention will be described with reference to the accompanying figures.

(Embodiment 1)

Figure 2:
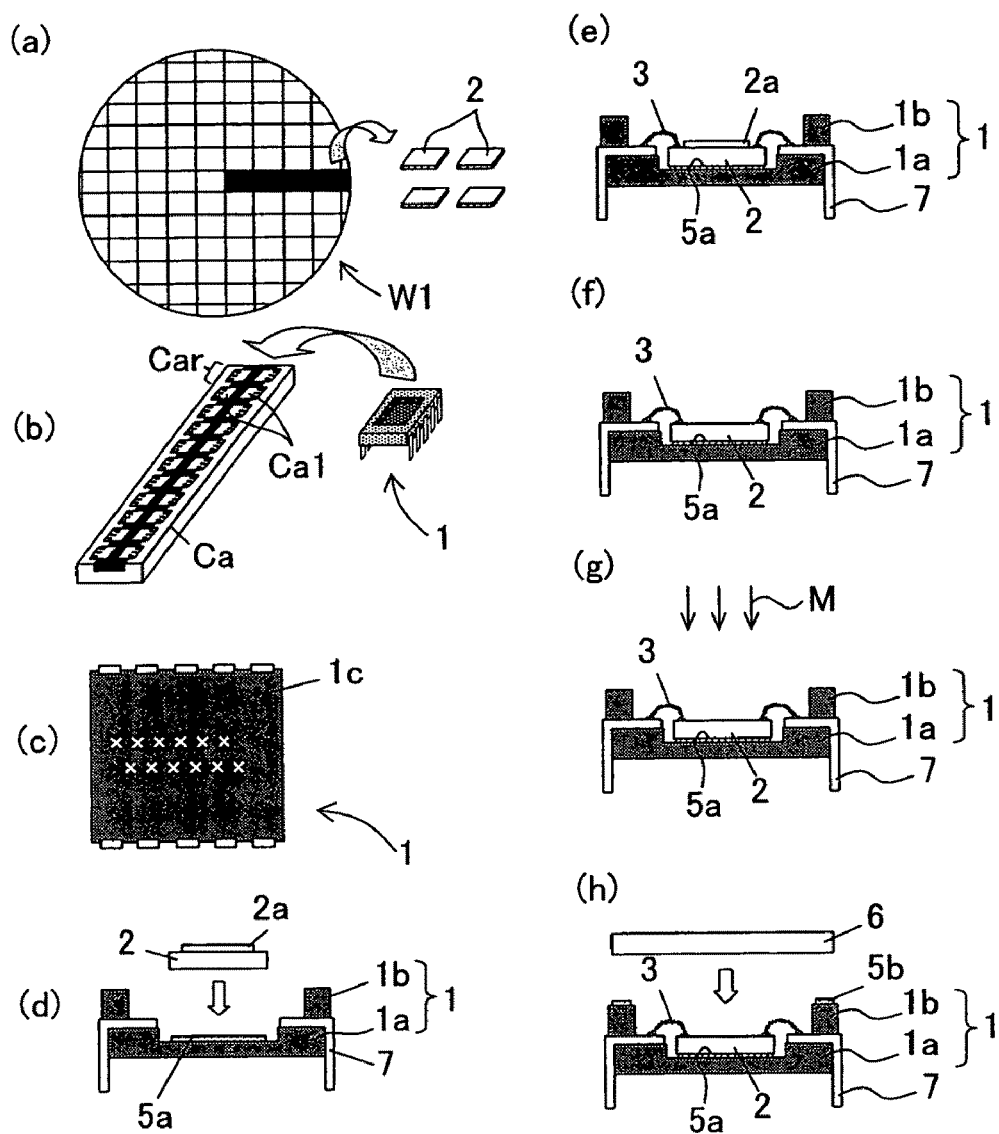
FIG. 2 is a diagram illustrating a manufacturing method of the solid-state image capturing apparatus according to Embodiment 1, illustrating a method for mounting an image capturing element chip on a sealing package (FIG. 2(a) to FIG. 2(h)) in the respective steps.

FIGS. 1 and 2 are diagrams illustrating a structure of a solid-state image capturing apparatus according to Embodiment 1 of the present invention. FIG. 1(a) is a diagram illustrating a cross sectional structure of the solid-state image capturing apparatus, and FIG. 1(b) is an enlarged view illustrating a microlens and a protective film thereabove.

A solid-state image capturing apparatus 100 according to Embodiment 1 includes a mounting structure where a sealing package 1 houses an image capturing element chip (solid-state image capturing element) 2 and a lid glass 6 covers the sealing package 1 to seal the image capturing element chip 2 in such a manner to form a hollow area above the image capturing element chip 2.

Herein, the sealing package 1 includes a package substrate 1a and an external wall portion 1b formed in an outer circumference portion of the package substrate 1a, and the image capturing element chip 2 is fixed with an adhesive 5a in an area of the package substrate 1a that is surrounded by the external wall portion 1b. In addition, the sealing package 1 includes a plurality of external lead terminals 7 positioned on both of the side edge portions of the package substrate 1a. A portion (inner end portion) of the external lead terminal 7, which is on the image capturing element chip 2 side, penetrates the external wall portion 1b and positions near the image capturing element chip 2. Further, the inner end portion of the external lead terminal 7 is connected to the electrode pad of the image capturing element chip 2 by a bonding wire 3. In addition, a lid glass 6 is fixed with a glass seal 5b above the external wall portion 1b of the sealing package described above in such a manner to hermetically seal a space inside the sealing package. Herein, the sealing package 1 is formed of a mold resin and ceramic.

Figure 12:
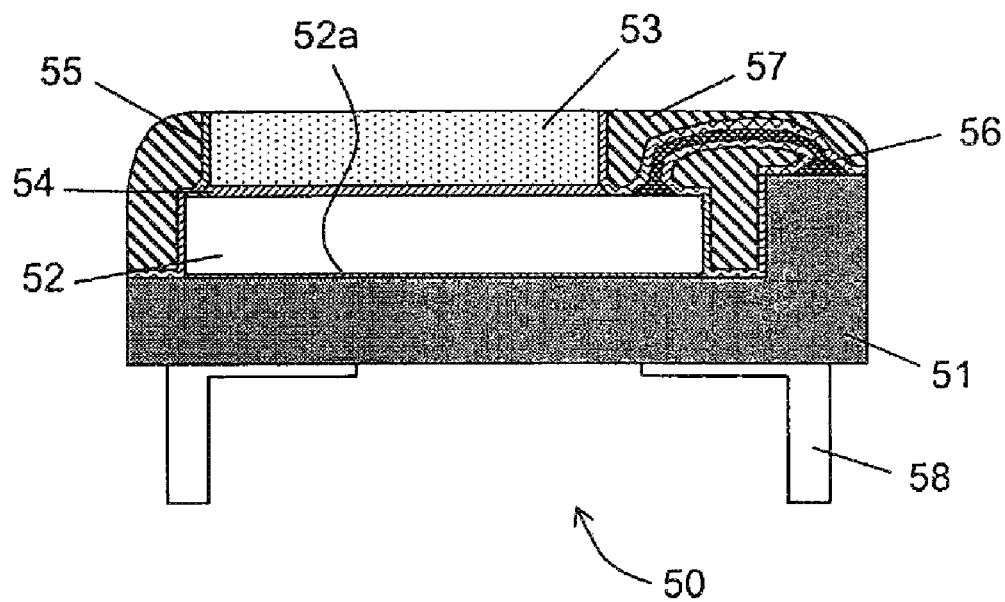
FIG. 12 is a diagram illustrating a conventional solid-state image capturing apparatus, illustrating a mounting structure where an image capturing chip is sealed with resin on a ceramic substrate.
Figure 13:
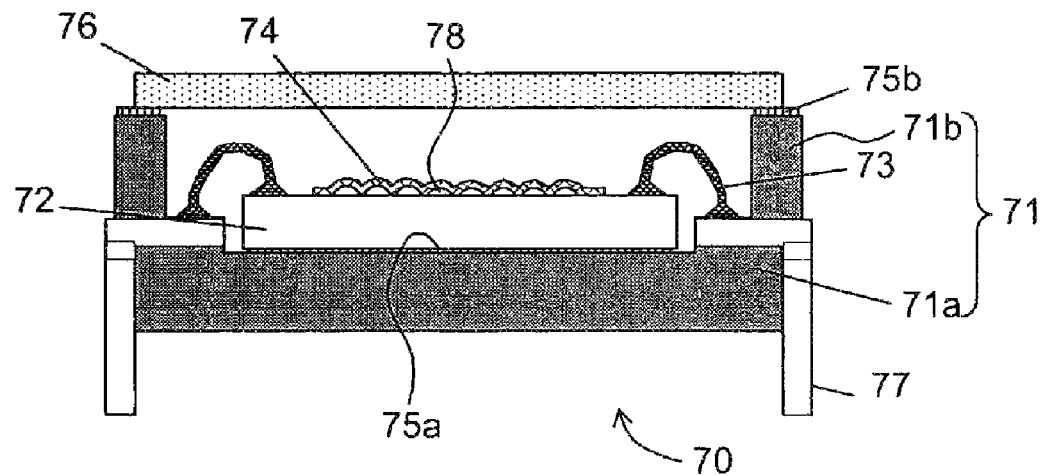
FIG. 13 is a diagram illustrating a structure of another conventional solid-state image capturing apparatus.
Figure 13:
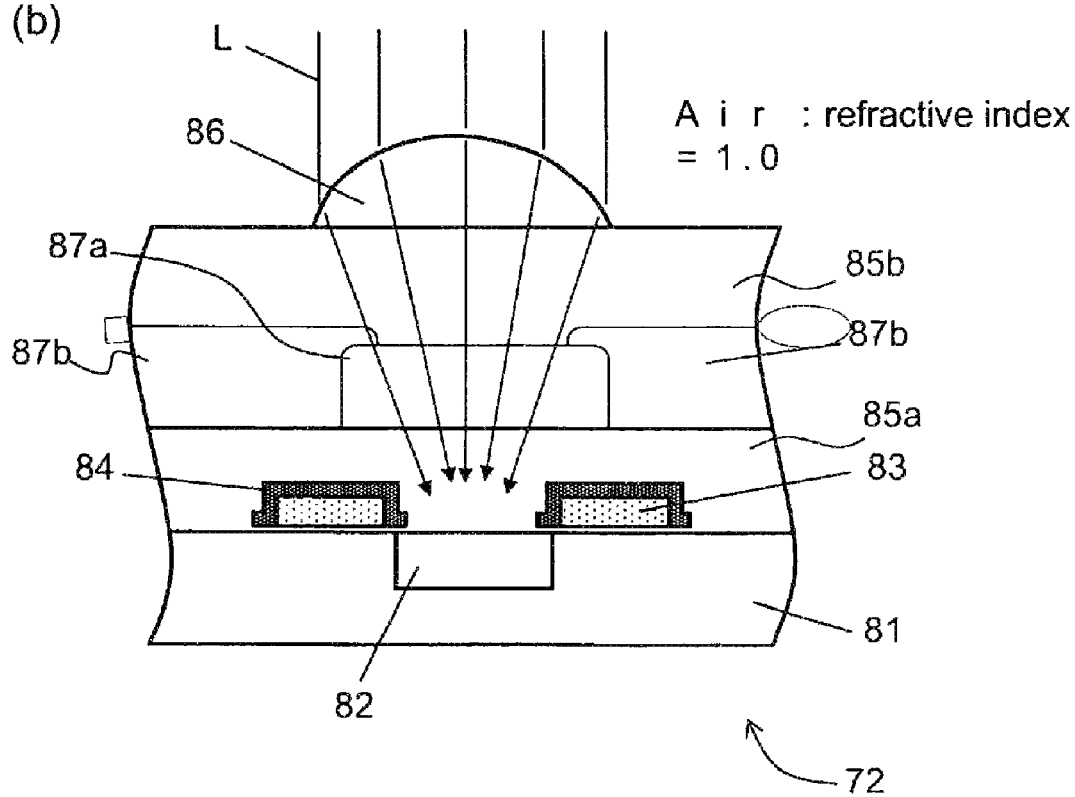

Such mounting structure of the solid-state image capturing apparatus 100 according to Embodiment 1 is identical to the mounting structure of the conventional solid-state image capturing apparatus illustrated in FIG. 12(a).

In the solid-state image capturing apparatus 100 according to Embodiment 1, all of the inner surface of the sealing package 1, the surface of the image capturing element chip 2 and the surface of the bonding wire 3, which are exposed in the hermetically sealed space formed by the sealing package 1 and the lid glass 6, are covered with the protective film 4.

Herein, the protective film 4 is a $SiO_2$ film, and light L that has entered the surface of the image capturing element chip 2 is refracted at the surface of the protective film 4 to be closer to a center portion of each pixel, as illustrated in FIG. 1(b). Further, the light L is refracted at an interface of the microlens 8 and the protective film 4 to be closer to the center portion of each pixel.

In such sealing package that seals and houses the image capturing element chip 2 with a microlens, it is known, from the viewpoint of the structure, that an influence to the image capturing element chip 2 due to the infiltration of moisture from the glass seal portion can be prevented.

Next, a mounting method will be described.

That is, in a manufacturing method for the solid-state image capturing apparatus according to Embodiment 1, an image capturing element wafer W1, which is formed in a former half wafer process, is cut for each image capturing element chip 2 (die), and each image capturing element chip (only the ones with good quality) is taken out (FIG. 2(a)). At this stage, a resist 2a for protecting a surface is formed only on an image capturing area of the image capturing element chip 2. That is, no resist remains on an electrode pad of the image capturing element chip 2.

Figure 14:
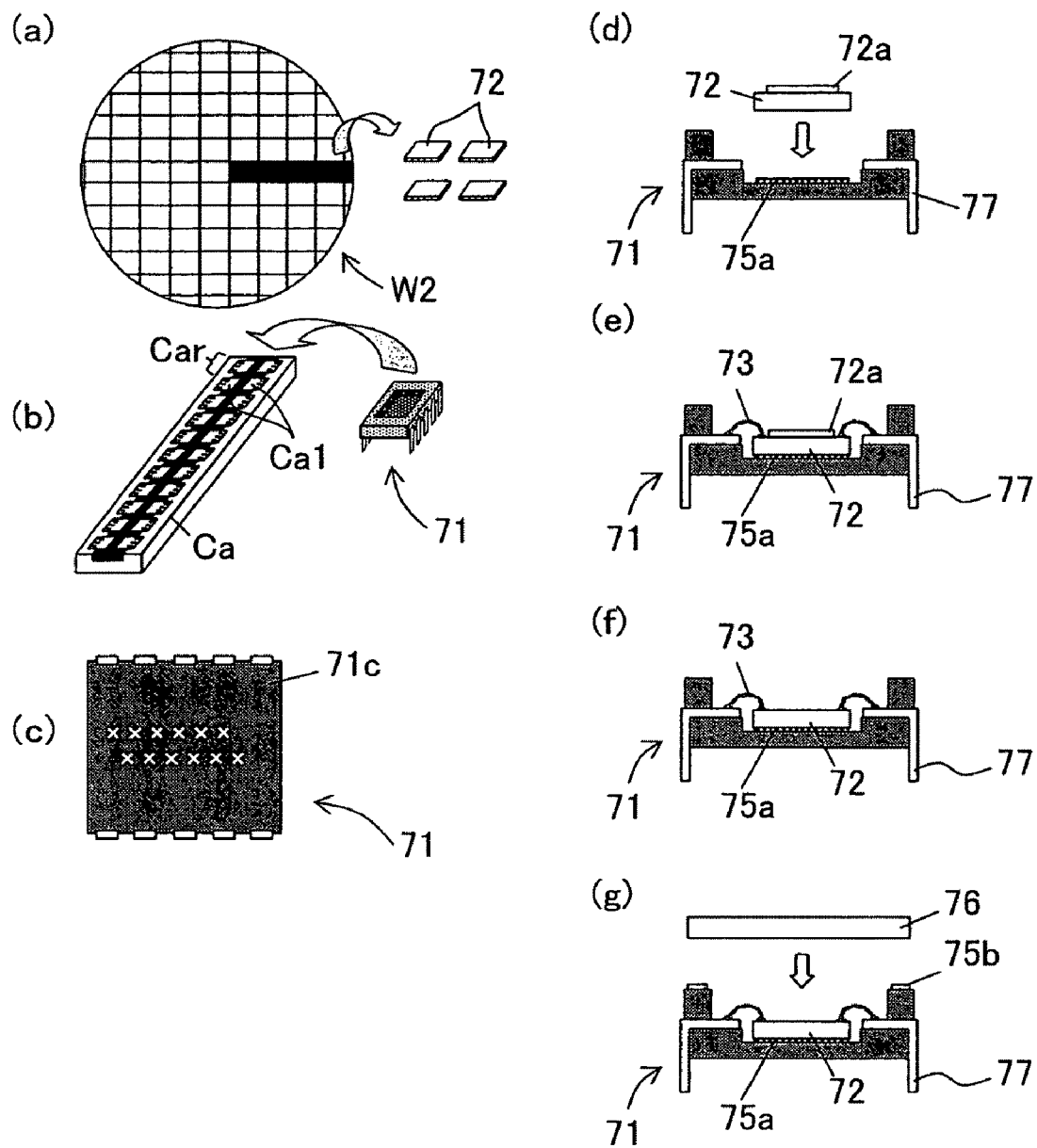
FIG. 14 is a diagram illustrating a method for mounting an image capturing element chip on a sealing package in the respective steps (FIGS. 14(a) to 14(g))

Next, the sealing package 1 without a die mounted thereon is mounted on a sealing process (latter half process) flowing carrier Ca (FIG. 14(b)). Herein, the flowing carrier Ca is identical to the flowing carrier Ca used for the conventional mounting method described in FIG. 12 and the flowing carrier Ca is formed to be capable of mounting 5 to 10 of the sealing packages 1. Further, either of a resin mold package or a ceramic package can be used as the sealing package, and it will make no difference in the manufacturing steps.

After a model name, manufacturer name and the like are printed on a back surface 1c of the package substrate 1a (FIG. 2(c)), the image capturing element chip (die) 2 is adhered to the sealing package 1 with the adhesive 5a (FIG. 2(d)).

Subsequently, an electrode terminal of the image capturing element chip 2 and the external lead terminal 7 are connected to each other with a gold wire 3 (FIG. 2(e)).

Further, the resist 2a for protecting the element surface is removed (FIG. 2(f)), and subsequently, the sealing package 1 housing the image capturing element chip 2 is put in a plasma CVD apparatus, with an upper surface of the sealing package being opened, and the protective film 4 is formed on all of the inner surface of the sealing package, the surface of the gold wire (bonding wire), and the surface of the image capturing element chip (FIG. 2(g)).

FIGS. 3(a) and 3(b) are respectively a top view and a side view, illustrating a structure of the image capturing element chip 2 in this state.

Figure 3:
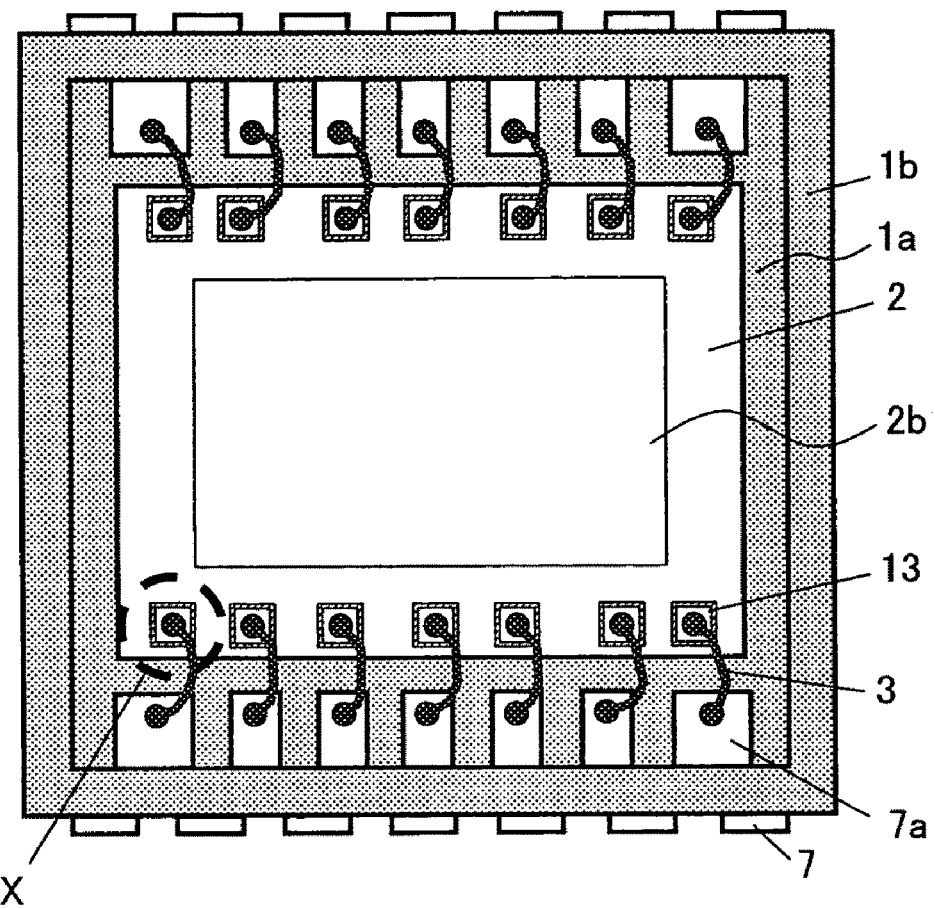
FIG. 3 is a diagram illustrating the solid-state image capturing apparatus according to Embodiment 1.
Figure 3:
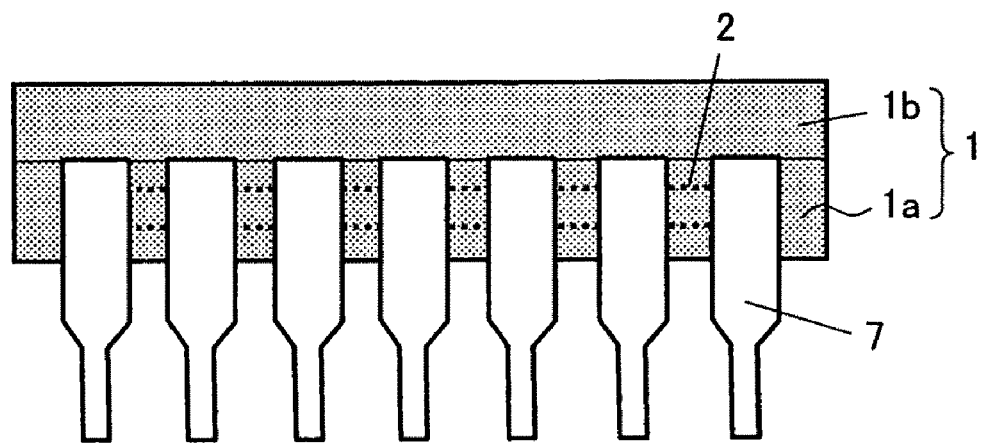

As can be understood from FIG. 3, the image capturing element chip 2 is housed in the sealing package 1, and a plurality of electrode pads (metal wiring) 13 are arranged on both sides of an image capturing area 2b, in which a plurality of pixels are arranged, of the image capturing element chip 2. In addition, a portion 7a of the external lead terminal 7 inside the sealing package 1 and the electrode pad (metal wiring) 13 of the image capturing element chip 2 are connected to each other with the bonding wire 3.

Figure 4:
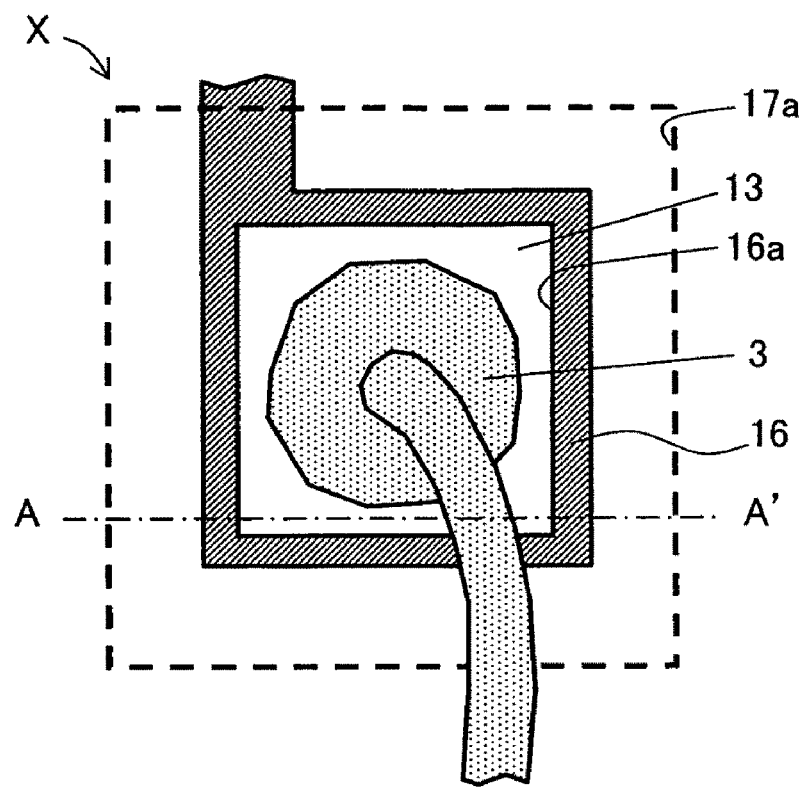
FIG. 4 is an enlarged view illustrating an X portion in FIG. 3(a).
Figure 4:
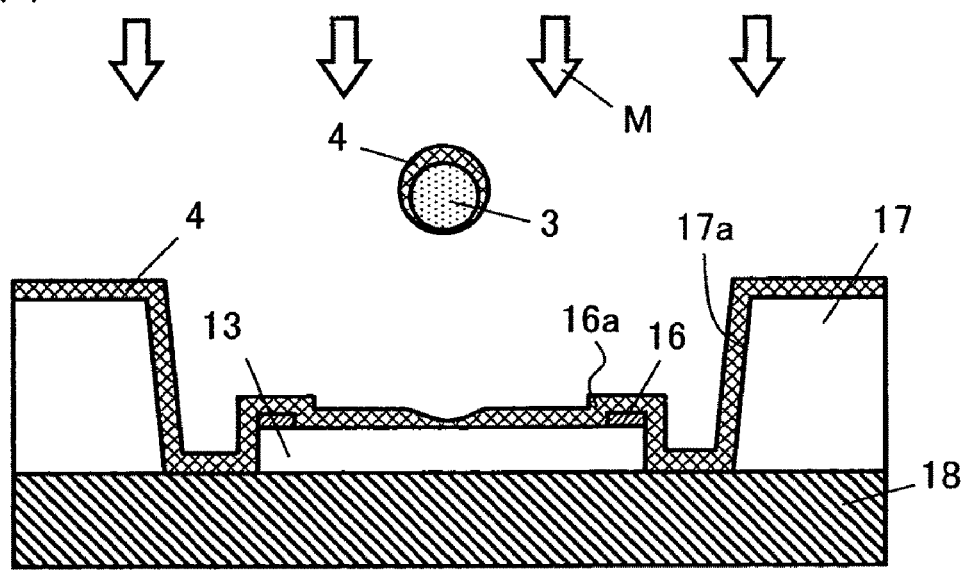

FIG. 4 is an enlarged view of an X portion of FIG. 3(a). FIG. 4(a) is a diagram illustrating a plan structure of the electrode pad portion described above. FIG. 4(b) is a diagram illustrating a cross sectional structure along a line A-A' in FIG. 4(a).

As can be understood from FIG. 4, the metal wiring (aluminum wiring) that forms the electrode pad 13 described above is positioned above the silicon substrate (see FIG. 12(b)) with a metal ground insulation film 18 interposed therebetween. A metal surface reflection preventing film 16 is formed on a surface of the metal wiring, the metal surface reflection preventing film 16 being for preventing reflection on the surface of the metal wiring. The reflection preventing film 16 is for reducing a reflection of an exposure light at a patterning process using an exposure phenomenon of a resist and the like in order to be capable of forming a fine pattern. However, the metal surface reflection preventing film 16 is removed from a portion of the electrode pad 13 for connecting the bonding wire 3 in order to reduce a contact resistance. In this portion, an opening 16a of the metal surface reflection preventing film 16 is formed. Further, in the electrode pad 13 and the peripheral portion, an above-element organic material film (constituent material film for a planarization film and the like) 17, which is composed of an organic material, is removed from above the metal ground insulation film 18, and an organic material film opening 17a is formed.

The protective film 4, which is formed by the CVD process, is formed on the entire surface of the image capturing element chip that includes the electrode pad 13 and the above-element organic material film 17 described above. Further, the protective film 4 is also formed on the surface of the bonding wire 3 described above.

Such formation of the protective film by the plasma CVD requires to process a great number of elements simultaneously in view of an actual mass production of the elements. Therefore, it is desirable to use a jig that is capable of housing a plurality of sealing packages.

Hence, about 50 to 100 of packages are housed in the protective film forming jig and the plasma CVD process is performed in the present embodiment. Further, the sealing package that mounts the image capturing element chip is going to be embedded in an electronic device and the like after shipped to a user as a matter of course, and the external lead terminal is required to be connected to another part in the electronic device. For this reason, if the protective film is formed on the external lead terminal, the protective film is required to be removed.

Therefore, the protective film forming jig described above has a structure to completely cover the side surface of the package and the external lead terminal portion so that they will not be exposed to plasma.

Figure 5:
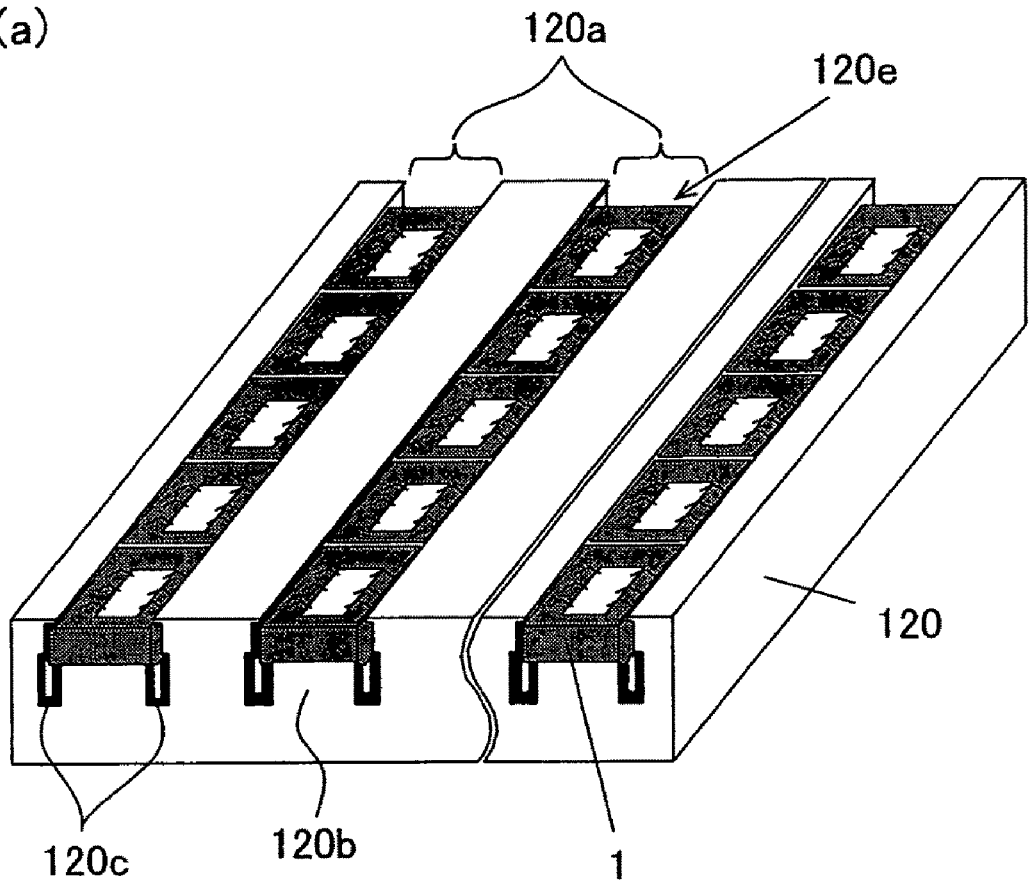
FIG. 5 is a diagram illustrating an exemplary structure of a jig used in a mounting method of Embodiment 1.
Figure 5:
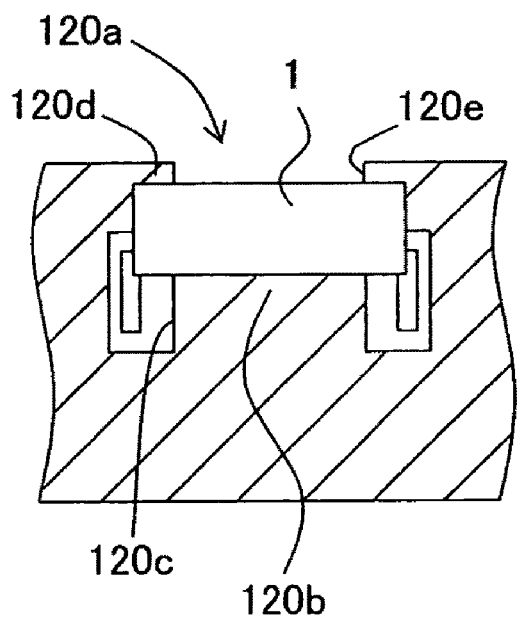

FIG. 5 is a diagram illustrating an exemplary structure of such a jig. FIG. 5(a) is a perspective view. Further, FIG. 5(b) is a cross sectional view.

A jig 120 is configured with a plurality of package arranging grooves 120a that are capable of positioning the plurality of sealing packages 1 in rows, the package arranging groove 120a being formed in a surface area of a flat-plate shaped member having a thickness greater than the sealing package described above.

Herein, a pair of lead housing grooves 120c are formed on both sides of the bottom of the package arranging groove 120a along a longitudinal direction. The lead housing groove 120c is for housing a tip of the external lead terminal 7 of the sealing package 1 described above.

In addition, a flange portion 120d is formed from both sides of an upper opening 120e of the package arranging groove 120a in such a protruding manner towards a middle portion of the opening. When the image capturing element chip 2 is positioned in the package arranging groove 120a, both sides of the upper surface of the image capturing element chip 2 is covered by the flange portion 120d. Therefore, when the image capturing element chip 2 is positioned in the package arranging groove 120a of the jig 120 with such a structure, the image capturing element chip 2 is inserted from the side surface that is orthogonal to the package arranging groove 120a described above.

Figure 6:
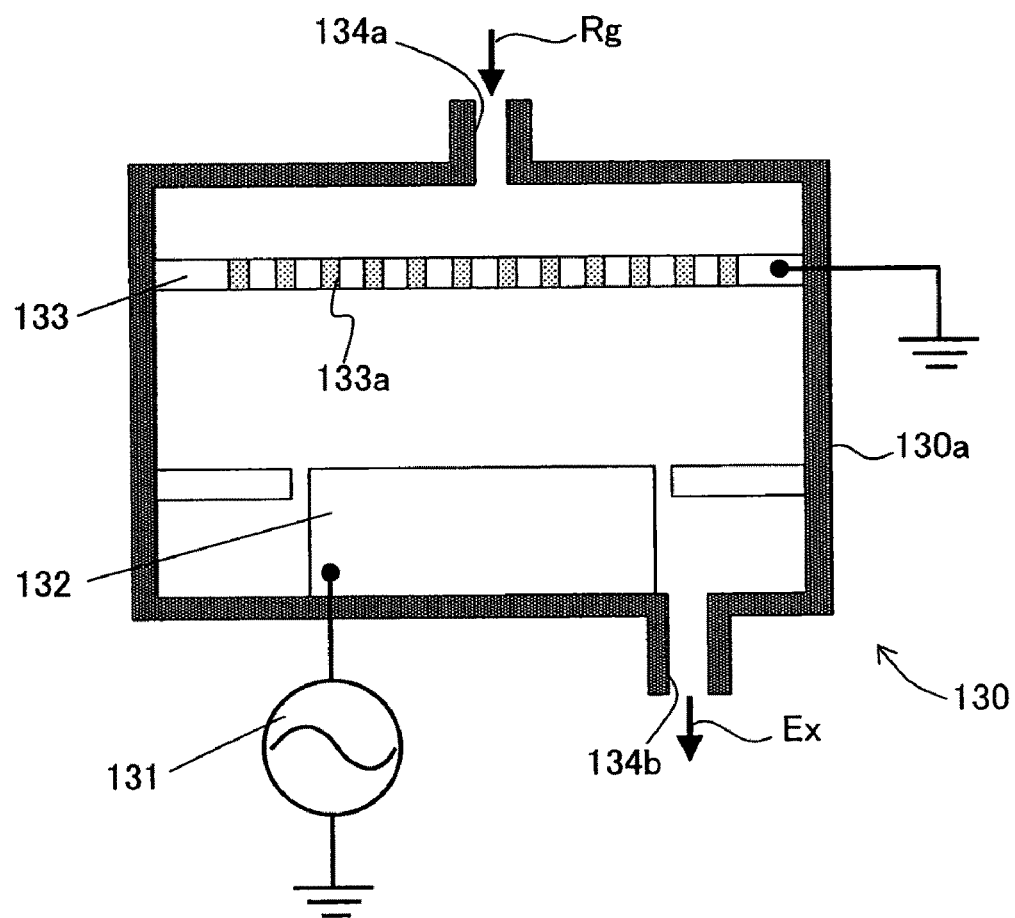
FIG. 6 is a diagram illustrating a CVD apparatus used in a mounting method of Embodiment 1.

FIG. 6 is a diagram illustrating the CVD apparatus described above.

A CVD apparatus 130, which is illustrated in FIG. 6, includes: a decompression processing room (chamber) 130a for performing a CVD process; a lower electrode 132 positioned in the chamber 130a and connected to a ground potential; an upper electrode 133 positioned facing the lower electrode 132; and an RF power source 131 for applying an RF voltage to the lower electrode. Herein, the lower electrode 132 also serves as a sample stage. In addition, the upper electrode 133 is configured with a conductive plate member having a plurality of penetrating apertures 133a formed therein, the upper electrode 133 also serving as a gas diffusion plate for diffusing a reaction gas Rg introduced from an upper opening 134a formed in an upper wall of the chamber 130a. In addition, a lower opening 134b is formed in a bottom surface of the chamber 130a, and a decompressed atmosphere is formed in the chamber by evacuation from the lower opening 134b.

Hereinafter, a method by the CVD apparatus described above for performing the CVD process for a plurality of packages using the jig 120 described above will be briefly described.

First, after the resist film, which is formed on the image capturing element chip 2, is removed (see FIG. 2(f)), the sealing package maintained in the carrier Ca is transferred to the protective film forming jig 120. More specifically, the sealing package 1 removed from the carrier Ca is inserted into each package arranging groove 120a successively from an end surface of one end side of the protective film forming jig 120, and all the package arranging groove 120a attach the sealing packages 1.

Next, the protective film forming jig 120 is mounted on the lower electrode (sample stage) 132 inside the chamber of the CVD apparatus 130. Subsequently, the RF power source 131 is applied to the lower electrode 132, and the reaction gas Rg is introduced from the upper opening 134a of the chamber 130a. Further, the evacuation from the lower opening 134b of the chamber 130a is performed so that the atmosphere of the chamber 130a is decompressed.

At this stage, the reaction gas Rg introduced from the upper opening 134a is diffused at the reaction gas diffusion plate 133, which is the upper electrode described above; and the reaction gas with even concentration is provided on the surface of the protective film forming jig 120 that is on the sample stage 132, or the lower electrode described above.

As a result, a material M of the protective film is evenly accumulated on an exposed surface of each sealing package that is maintained in the protective film forming jig 120, and the protective film 4 is formed on the inner surface of the sealing package, the surface of the image capturing element chip 2, and the surface of the wire.

Subsequently, the lid glass 6 is adhered on each sealing package 1 with a UV cured resin 5b in a similar manner as the conventional lid-glass adhering method (FIG. 2(h)).

Next, conditions for the CVD process described above and the type of the protective films formed will be described.

First, with regard to the conditions for the CVD process, the CVD process described above is performed at a relatively low vacuum atmosphere of about 10 Pa to 2000 Pa. The evacuation is performed by a single rotary pump or a combination of a rotary pump and a turbo pump. In addition, with regard to the RF power source for applying the RF voltage to the lower electrode 132 of the CVD apparatus 130, it is an alternating-current source capable of generating voltage of a frequency of 13.56 MHz or voltage of a frequency of 400 kHz. By applying voltage of such frequencies to the lower electrode 132, plasma is generated between the grounded upper electrode 133 and the lower electrode 132 to which alternating voltage is applied.

In addition, the temperature of the lower electrode (stage temperature) cannot be set at a relatively high temperature, which is used at the former half process (wafer process), since an on-chip film, or a film formed on the image capturing element chip 2, is formed of an organic film. The protective film described above is formed at a stage temperature of 180 to 200 degrees Celsius. In addition, the stage temperature in the forming of the film in the former half process is about 300 to 400 degrees Celsius.

In addition, with regard to the type of the protective film to be formed, as one example, when $SiO_2$ (silicon dioxide) is formed as the protective film 4, TEOS (tetraethyl orthosilicate or ethyl ethoxy silane) and $O_2$ (oxygen) are used as the reaction gas.

In addition, when SiN (silicon nitride) is formed as the protective film 4, $SiH_4$ (silane), $NH_3$ (ammonia) and $N_2$ are used as the reaction gas.

Further, when SiON (silicon oxynitride) is used as the protective film 4, $SiH_4$ (mono-silane), $N_2O$ (nitric oxide) and He are used as the reaction gas.

In the present embodiment, the thickness of the planarization film, color filter, and microlens in the image capturing element chip 2 is the same as the thickness used in the conventional image capturing element chip 72. Further, in the present embodiment, the thickness of the protective film 4 is about 100 nm to 500 nm, and more preferably, about 100 nm to 300 nm.

Next, a function and effect will be described.

As described above, when the protective film 4 is formed for the purpose of preventing an incident light from reflecting on the surface of the microlens, it is ideal for the film to have a refractive index ranging between the refractive index of the lens material of 1.60 and the refractive index of air of 1.00, and therefore, it is ideal to use a silicon oxide film (refractive index of 1.45) among ordinary semiconductor materials.

In this case, although the moisture resistance is improved better than the case where the surface of the image capturing element chip 2 and the wire is completely exposed, the silicon oxide film does not have a high moisture resistance. Therefore, when high moisture resistance is required for the reason of the usage of the element and the like, it is necessary to use a silicon nitride film with high moisture resistance (refractive index of 2.00).

In such a case with a silicon nitride film, it is not possible to reduce a reflection of an incident light at a surface of a microlens, resulting in a small reduction of the incident light (which means a reduction of sensitivity). Although it is possible to use a silicon oxynitride film (SiON) (refractive index of about 1.80, which varies depending on the composition) that has a characteristic of both a silicon oxide film and a silicon nitride film, there may be a possibility of incomplete achievement for the moisture resistance and the reflection preventing effect. Therefore, it is necessary to select an appropriate film depending on the performance for which the element is required.

Next, a focusing of light by a microlens will be described, using each of a silicon oxide film, a silicon oxynitride film and a silicon nitride film, as the protective film described above.

As described previously, an incident light is refracted due to a refractive index of a film in the front and the back of a path of the incident light as well as a shape of a matter that is a target of light to enter. Hereinafter, the difference between a case where a silicon oxide film is used and a case where a silicon nitride film is used, as a protective film on a surface of a microlens, will be described with reference to FIGS. 1(b) and 1(c).

FIGS. 1(b) and 1(c) are enlarged views illustrating the right half portion of a microlens of the image capturing element chip 2 described above. FIGS. 1(b) and 1(c) illustrate a path inside the protective film and the microlens of an incident light entering the image capturing element chip 2. Further, FIG. 1(b) illustrates a case where a silicon oxide film is used as a protective film, and FIG. 1(c) illustrates a case where a silicon nitride film is used as a protective film.

Light (incident light) L, which enters a microlens via a silicon oxide film (the protective film 4 described above), passes through air (refractive index of 1.0), a silicon oxide film (refractive index of 1.45) as a protective film 4, and an acrylic film (refractive index of 1.60) as a microlens 8 respectively. Depending on the difference of the refractive indexes and the shapes, the light L is not refracted at the interface of the air and silicon oxide film, and the light L is refracted towards a light focusing direction (inner side) at the interface of the silicon oxide film and acrylic film.

On the other hand, when a silicon nitride film 4a is used as the protective film 4, the incident light L passes through air (refractive index of 1.0), a silicon nitride film 4a (refractive index of 2.00), and an acrylic film 8 (refractive index of 1.60) respectively. The incident light L is greatly refracted towards the light focusing direction (inner side) at the interface of the air and silicon nitride film 4a, and the incident light L is refracted towards a diffusing direction (outer side) at the interface of the silicon nitride film 4a and acrylic film 8.

In the cases illustrated in FIGS. 1(b) and 1(c), an angle of the incident light L perpendicular to an image capturing surface is defined as an angle θ1 and an angle θ2 respectively at the time when the incident light L passes through the microlens, the angle θ1 and angle θ2 being almost equal. Accordingly, an almost similar light focusing path is created at the end no matter what kind of refractive index the material to insert is used between the air and the acrylic film functioning as a microlens. Even if there is a little difference in the focusing of the light, such a difference is within an easily adjustable range by re-setting the shape of the microlens.

According to Embodiment 1 as described above, all of the inner surface of the sealing package, the surface of the image capturing element chip 2 and the surface of the bonding wire, which are exposed in the sealing package, are completely covered with the protective film, so that no corrosion or the like of the element wire occurs and an element with high reliability can be achieved even if moisture infiltrates inside the sealing package.

In addition, the reflection of the light that enters the microlens is prevented when a silicon oxide film is used as the protective film, whereas the moisture resistance is increased when a silicon nitride film is used as the protective film. Further, the reflection of the incident light to the microlens is controlled so as not to be so high while the moisture resistance is maintained relatively high when a silicon oxynitride film is used as the protective film. Therefore, as in Embodiment 1, the surface of the image capturing element chip 2 and the surface of the bonding wire are completely covered with the protective film in the mounting structure where the image capturing element chip housed in the sealing package is sealed by providing a hollow space above the microlens, so that a solid-state image capturing apparatus with the moisture resistance in accordance with its use can be provided.

Further, according to Embodiment 1, although the sealing package is transferred from the latter half process flowing carrier Ca to the plasma CVD jig 120 in the CVD process for forming the protective film on the surface of the image capturing element chip 2, the latter half process flowing carrier Ca can be used as a CVD jig by forming the latter half process flowing carrier Ca in such a manner that the protective film is not adhered to an unnecessary portion, such as the external lead terminal of the image capturing element chip 2. In addition, the step of transferring the sealing package from the latter half process flowing carrier Ca to the plasma CVD jig 120 can be omitted by forming the plasma CVD jig 120 in such a manner to be capable of housing the latter half process flowing carrier Ca.

Further, according to Embodiment 1, although the protective film is formed in one CVD process, the CVD process can be performed for several times.

For example, when the protective film 4 is formed by accumulating a film forming material by the plasma CVD process from directly above the image capturing element chip 2, as illustrated in FIG. 4(b), the protective film 4 may be very thin at a back side of the gold wire (bonding wire) 3 on the surface of the image capturing element chip 2.

Thus, the CVD jig 120 is formed in such a manner that the CVD jig 120 is inclined and mounted on the surface of the mounting surface, or the lower electrode (sample stage), and the formation of the protective film is performed at least twice while changing the inclined angle of the CVD jig 120 with respect to the mounting surface. As a result, the protective film can be prevented from being very thin to the utmost at the back side of the gold wire (bonding wire) 3 on the surface of the image capturing element chip 2.

Figure 7:
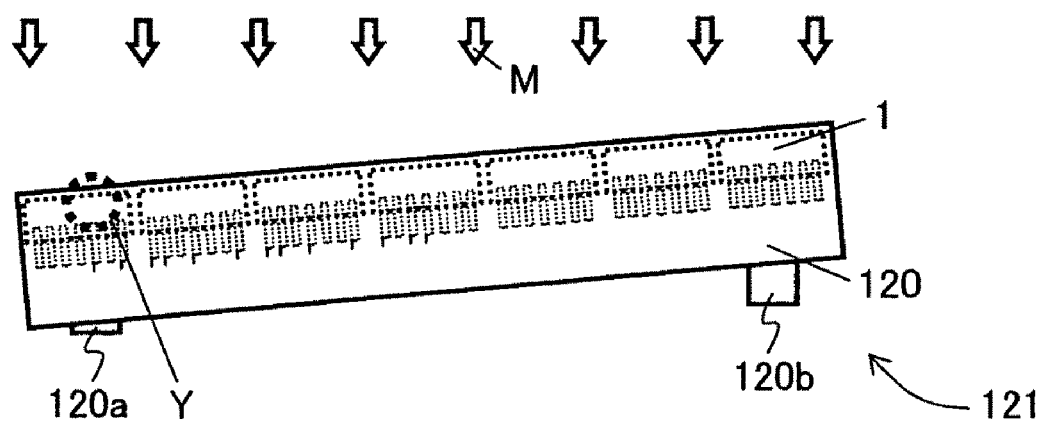
FIG. 7 is a diagram illustrating an exemplary variation of Embodiment 1.
Figure 7:
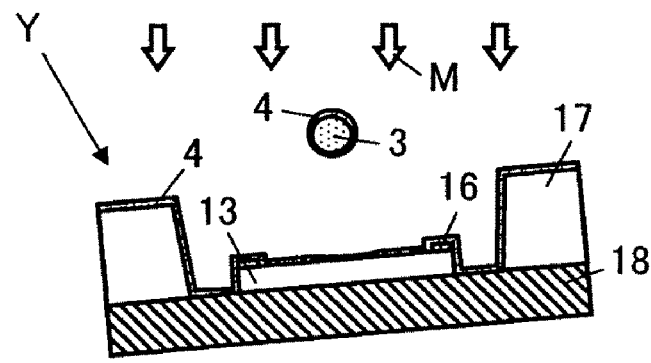
Figure 8:
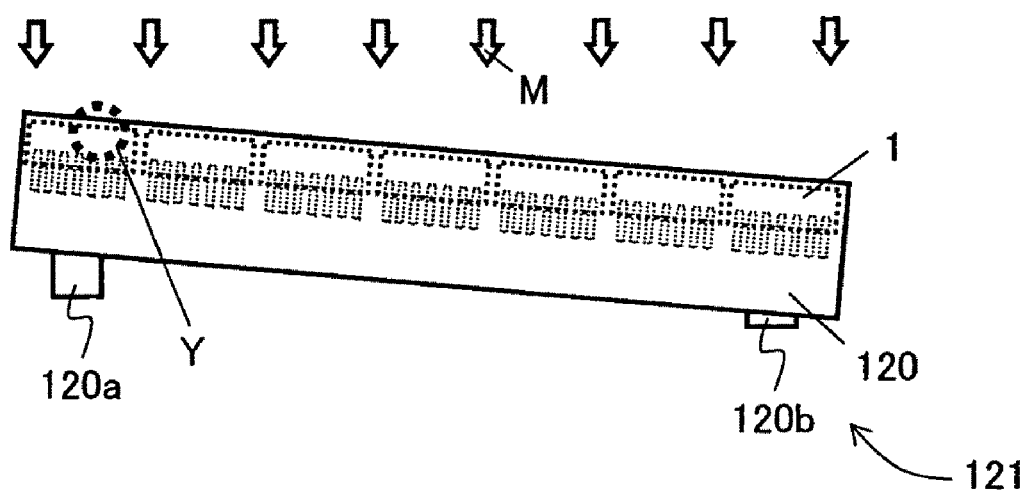
FIG. 8 is a diagram illustrating an exemplary variation of Embodiment 1.
Figure 8:
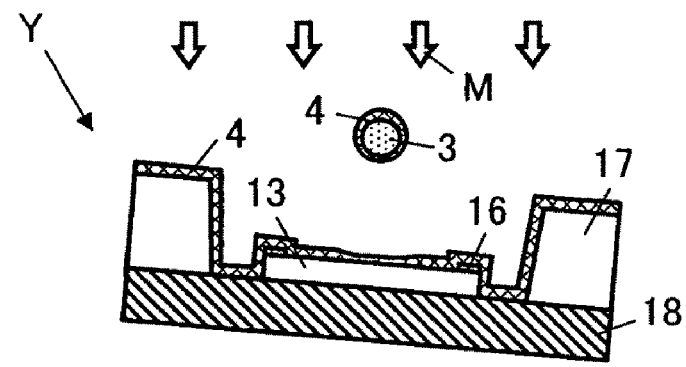

FIGS. 7 and 8 are diagrams illustrating the CVD process for forming the protective film by changing an angle of the CVD jig 120. FIG. 7(a) is a diagram illustrating a case where the CVD jig 120 is tilted with respect to the mounting surface (sample stage or the lower electrode 132 described above) so that the CVD jig 120 will be inclined to the left in the figure and the CVD process is performed on the image capturing element chip 2. FIG. 7(b) is a diagram illustrating a cross sectional structure of an electrode pad portion of the image capturing element chip 2 in a Y portion of FIG. 7(a). FIG. 8 is a diagram illustrating a case where the CVD jig 120 is tilted with respect to the mounting surface (sample stage or the lower electrode 132 described above) so that the CVD jig 120 will be inclined to the right in the figure and the CVD process is performed on the image capturing element chip 2. FIG. 8(b) is a diagram illustrating a cross sectional structure of an electrode pad portion of the image capturing element chip 2 in a Y portion of FIG. 8(a).

Herein, a CVD jig 121 is used as the CVD jig. The CVD jig 121 has a structure of the CVD jig 120 described in Embodiment 1 with left and right leg members 120a and 120b protruding downwards from a bottom surface side. The protruding length is adjustable. Note that the structure that is capable of changing the inclined angle with respect to the mounting surface is not limited to this.

As described above, by changing the angle of the CVD jig 121 housing the sealing package and performing the formation of the protective film in two steps, the film forming material can be accumulated in the second CVD process as illustrated in FIG. 8(b), at the portion where the protective film is thin because of being the back of the wire in the first CVD process (see FIG. 7(b)).

(Embodiment 2)

Figure 9:
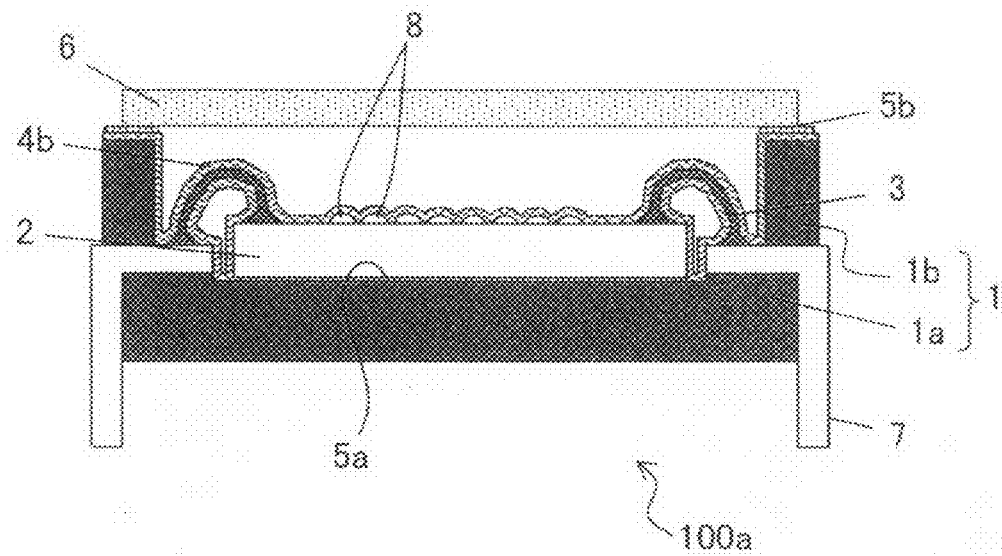
FIG. 9 is a diagram illustrating a structure of a solid-state image capturing apparatus according to Embodiment 2 of the present invention.
Figure 9:
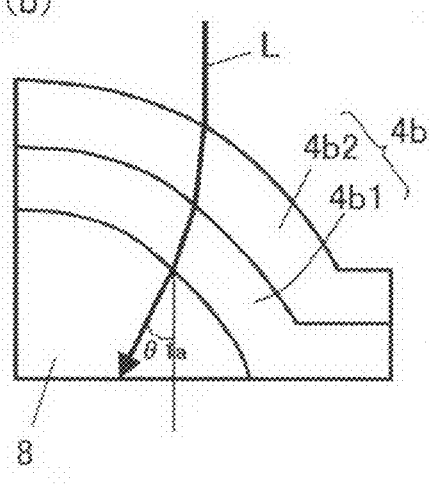
Figure 9:
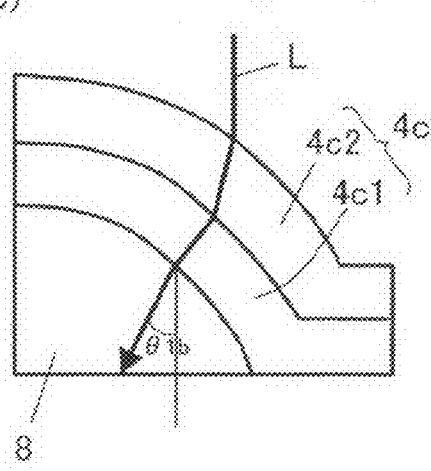
Figure 9:
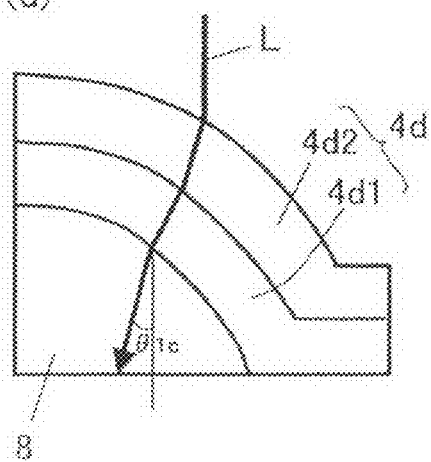
Figure 9:
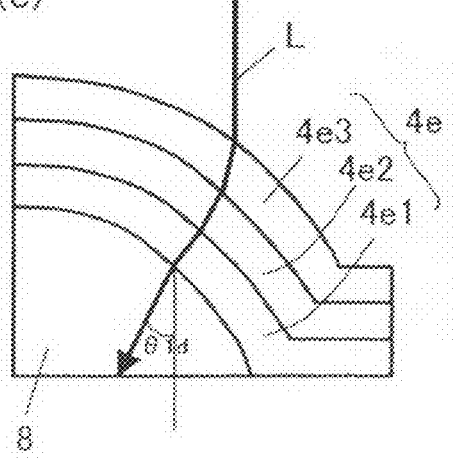

FIG. 9 is a diagram illustrating a structure of a solid-state image capturing apparatus according to Embodiment 2 of the present invention. FIG. 9(a) is a diagram illustrating a cross sectional structure of the solid-state image capturing apparatus. FIG. 9(b) is an enlarged view illustrating a microlens and a protective film thereabove.

A solid-state image capturing apparatus 100a according to Embodiment 2 includes a multilayer structure of the protective film of the image capturing element chip 2 in Embodiment 1, and the rest of the structure of the solid-state image capturing apparatus 100a is identical to that of Embodiment 1.

That is, according to the solid-state image capturing apparatus 100a of Embodiment 2, all of an inner surface of a sealing package 1, a surface of an image capturing element chip 2 and a surface of a bonding wire 3, which are exposed in a hermetically sealed space that is formed by the sealing package 1 and a lid glass 6, are covered with a protective film 4b of a multilayer structure.

Herein, as illustrated in FIG. 9(b), the protective film 4b includes a multilayer structure where two transparent insulation films 4b1 and 4b2 with different refractive indexes are laminated in such a manner that the one with a smaller refractive index is positioned on the surface side. Herein, an angle $\theta 1a$ of an incident light at a surface of a microlens can be set almost the same as the angle $\theta 1$ of Embodiment 1.

Herein, the transparent insulation film 4b1 on the inner side is a SiON film, and the transparent insulation film 4b2 on the outer side is a SiO$_2$ film.

In Embodiment 2 with the structure described above, the protective film 4b, which covers the surface of the image capturing element chip 2 and the surface of the bonding wire 3 exposed inside the sealing package 1 described above, includes the multilayer structure where two transparent insulation films 4b1 and 4b2 with different refractive indexes are laminated in such a manner that the one with a smaller refractive index is positioned on the surface side. As a result, a reflection of the incident light entering the microlens is controlled, and at the same time, a light focusing efficiency of the microlens is improved. Further, a high moisture resistance is achieved.

In Embodiment 2, the SiON film 4b1 and the SiO$_2$ film 4b2 are used as the transparent insulation films that constitute the two layered structure of the protective film. However, the transparent insulation films that constitute the two layered structure of the protective film are not limited to this.

For example, a SiO$_2$ film 4c2 on an outer side and a SiN film 4c1 on an inner side may be used as transparent insulation films that constitute two layered structure of a protective film 4c, as illustrated in FIG. 9(c). In addition, a SiON film 4d2 on an outer side and a SiN film 4d1 on an inner side may be used as transparent insulation films that constitute two layered structure of a protective film 4d, as illustrated in FIG. 9(d).

Further, the protective film described above is not limited to a two layered structure. For example, the protective film may include a three layered structure as illustrated in FIG. 4(e).

That is, a protective film 4e of a three layered structure illustrated in FIG. 4(e) includes a SiO$_2$ film 4e3 on an outer side, a SiN film 4e1 on an inner side, and a SiON film 4e2 in between.

Even in such a case where the protective film includes a multilayer structure, each transparent insulation film, which constitutes the protective film, can be formed by the CVD process as similar to the protective film of a single layered structure in Embodiment 1.

Further, an angle of an incident light at a surface of a microlens, namely, an angle $\theta 1b$ illustrated in FIG. 9(c), an angle $\theta 1c$ illustrated in FIG. 9(d), or an angle $\theta 1d$ illustrated in FIG. 9(e), can be set as similar to the angle $\theta 1$ in Embodiment 1.

In Embodiment 2, the protective film includes the multilayer structure where transparent insulation films with different refractive indexes are laminated. Therefore, in addition to the effect of Embodiment 1, a reflection of an incident light at a surface of the protective film can be controlled while a moisture resistance is improved.

(Embodiment 3)

Figure 10:
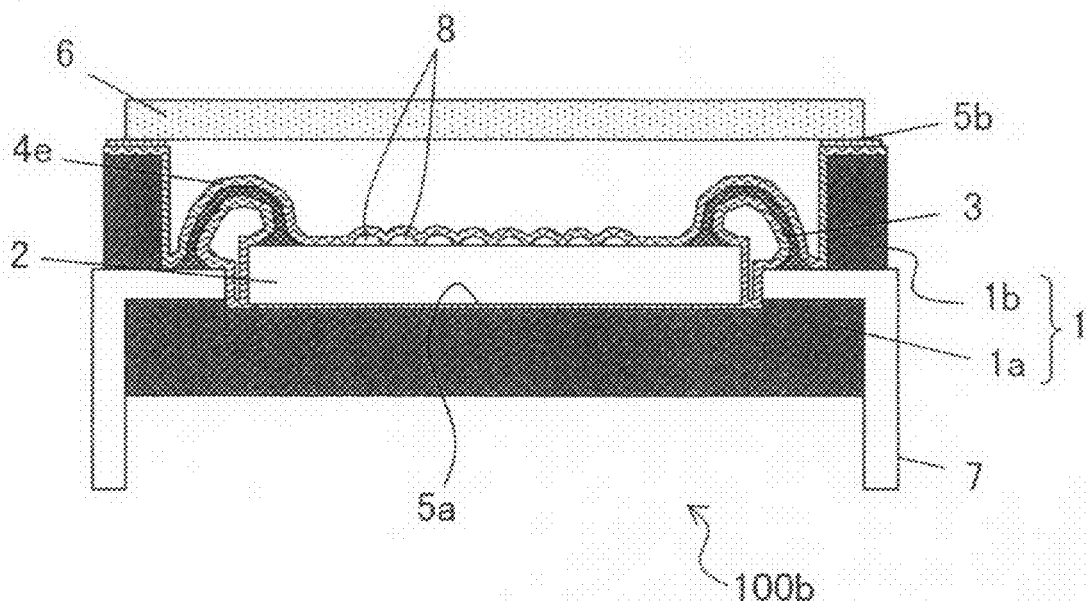
FIG. 10 is a diagram illustrating a structure of a solid-state image capturing apparatus according to Embodiment 3 of the present invention.
Figure 10:
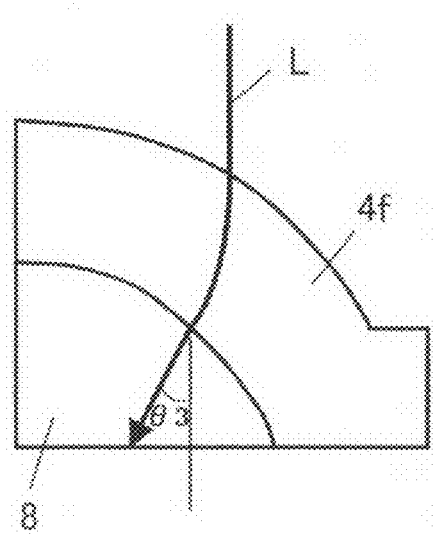

FIG. 10 is a diagram illustrating a structure of a solid-state image capturing apparatus according to Embodiment 3 of the present invention. FIG. 10(a) is a diagram illustrating a cross sectional structure of the solid-state image capturing apparatus. FIG. 10(b) is an enlarged view illustrating a microlens and a protective film thereabove.

A solid-state image capturing apparatus 100b according to Embodiment 3 includes a structure where a refractive index of the protective film in the image capturing element chip 2 of Embodiment 1 is successively changed to be smaller towards the surface side. That is, the composition of the transparent insulation films that constitute the protective film is successively changed, and the rest of the structure of the solid-state image capturing apparatus 100b is identical to that of Embodiment 1.

That is, according to the solid-state image capturing apparatus 100b of Embodiment 3, all of an inner surface of a sealing package 1, a surface of an image capturing element chip 2 and a surface of a bonding wire 3, which are exposed in a hermetically sealed space that is formed by the sealing package 1 and a lid glass 6, are covered with a protective film 4f with successively changed refraction index.

Herein, the protective film 4f includes a SiON film in which a ratio of oxygen and nitrogen is successively changed in such a manner that the refractive index becomes smaller towards the surface side. Further, in this case, an angle $\theta 3$ of an incident light at a surface of a microlens can be set as similar to the angle $\theta 1$ in Embodiment 1.

Thus, according to Embodiment 3, the protective film 4f, which covers the surface of the image capturing element chip 2 and the bonding wire 3 that are exposed in the sealing package 1, is configured in such a manner that the refractive index is successively changed to be smaller towards the surface side. Therefore, in addition to the effect of Embodiment 1, a reflection of an incident light at a surface of the protective film can be controlled while a moisture resistance is improved.

(Embodiment 4)

Although not specifically described in Embodiments 1 to 3 described above, an electric information device having an image input device will be described hereinafter. The electric information device, such as a digital camera (e.g., digital video camera and digital still camera), an image input camera, a scanner, a facsimile machine and a camera-equipped cell phone device, includes an image capturing section using at least one of the solid-state image capturing apparatuses according to Embodiments 1 to 3 described above.

Figure 11:
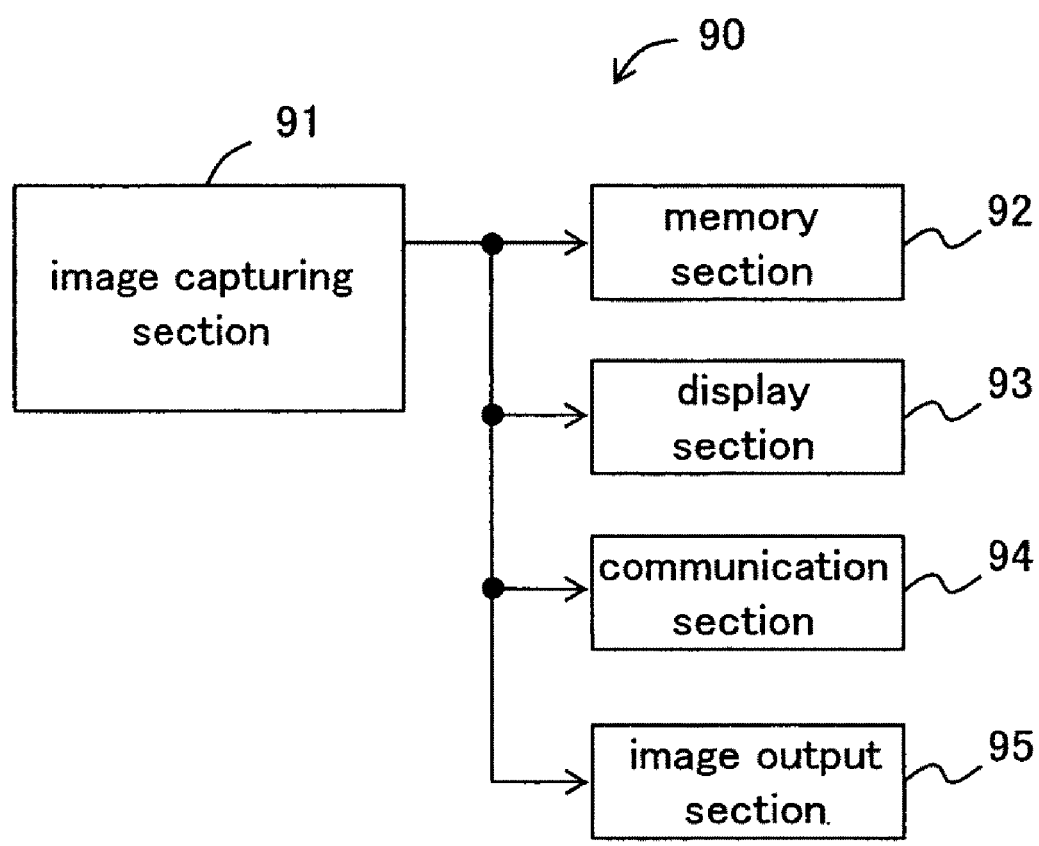
FIG. 11 is a block diagram illustrating an exemplary diagrammatic structure of an electronic information device, as Embodiment 4 of the present invention, using the solid-state image capturing apparatus according to any of Embodiments 1 to 3 of the present invention in an image capturing section thereof.

FIG. 11 is a block diagram illustrating an exemplary diagrammatic structure of an electronic information device, as Embodiment 4 of the present invention, using the solid-state image capturing apparatus according to any of Embodiments 1 to 3 of the present invention in an image capturing section thereof.

The electronic information device 90 according to Embodiment 4 of the present invention as illustrated in FIG. 11 includes any of the solid-state image capturing apparatuses according to Embodiment 1 to 3 of the present invention as an image capturing section 91 for capturing a subject. The electronic information device 90 further includes at least any of: a memory section 92 (e.g., recording media) for data-recording a high-quality image data obtained by capturing an image by the image capturing section, after a predetermined signal process is performed on the image data for recording; a display section 93 (e.g., liquid crystal display device) for displaying this image data on a display screen (e.g., liquid crystal display screen) after a predetermined signal process is performed for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred embodiments. However, the present invention should not be interpreted solely based on the embodiments described above. It is understood that the scope of the present invention should be interpreted solely based on the claims. It is also understood that those skilled in the art can implement equivalent scope of technology, based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing apparatus, a mounting method for the solid-state image capturing apparatus, a manufacturing method for the solid-state image capturing apparatus, and an electronic information device. According to the present invention, all the surfaces of the image capturing element chip and wire exposing inside the sealing package are covered with the protective film. Therefore, no corrosion or the like of the element wire occurs and an element with high reliability can be achieved even if moisture infiltrates inside the sealing package.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus, comprising:
an insulation substrate including an external lead terminal;
a solid-state image capturing element fixed on the insulation substrate and including a microlens; and
a transparent glass member positioned above the insulation substrate for sealing the solid-state image capturing element fixed on the insulation substrate, and
an electrode of the solid-state image capturing element and the external lead terminal of the insulation substrate being connected by a wire,
wherein the transparent glass member is positioned in such a manner that a hollow space is formed between a microlens of the solid-state image capturing element and the transparent glass member,
wherein portions of the insulation substrate, the solid-state image capturing element and the wire, which are exposed in the hollow space, are all covered with a protective film and
wherein a refractive index of the protective film is smaller than a refractive index of a constituent material of the microlens and larger than a refractive index of air.

2. A solid-state image capturing apparatus according to claim 1, wherein the protective film is one of a $SiO_2$ film, a SiON film and a SiN film.

3. A solid-state image capturing apparatus according to claim 1, wherein the protective film includes a multilayer structure where a plurality of transparent insulation films with different refractive indexes are laminated in such a manner that one with a smaller refractive index is positioned on a surface side.

4. A solid-state image capturing apparatus according to claim 3,
wherein the protective film includes a two layered structure where two transparent insulation films with different refractive indexes are laminated in such a manner that one with a smaller refractive index is positioned on a surface side, and
wherein the transparent insulation film constituting the protective film on an outer side is a $SiO_2$ film and the transparent insulation film constituting the protective film on an inner side is a SiN film.

5. A solid-state image capturing apparatus according to claim 3,
wherein the protective film includes a two layered structure where two transparent insulation films with different refractive indexes are laminated in such a manner that one with a smaller refractive index is positioned on a surface side, and
wherein the transparent insulation film constituting the protective film on an outer side is a SiON film and the transparent insulation film constituting the protective film on an inner side is a SiN film.

6. A solid-state image capturing apparatus according to claim 3,
wherein the protective film includes a two layered structure where two transparent insulation films with different refractive indexes are laminated in such a manner that one with a smaller refractive index is positioned on a surface side, and
wherein the transparent insulation film constituting the protective film on an outer side is a $SiO_2$ film and the transparent insulation film constituting the protective film on an inner side is a SiON film.

7. A solid-state image capturing apparatus according to claim 3,
wherein the protective film includes a three layered structure where three transparent insulation films with different refractive indexes are laminated in such a manner that one with a smaller refractive index is positioned on a surface side, and
wherein the transparent insulation film constituting the protective film on an outer side is a $SiO_2$ film, the transparent insulation film constituting the protective film on an inner side is a SiN film, and the transparent insulation film constituting the protective film in a middle portion is a SiON film.

8. A solid-state image capturing apparatus according to claim 1, wherein the protective film has a refractive index that is successively changed to be smaller towards a surface side.

9. A solid-state image capturing apparatus according to claim 8, wherein the protective film includes a SiON film in which a ratio of oxygen and nitrogen is successively changed in such a manner that the refractive index becomes smaller towards the surface side.

10. A solid-state image capturing apparatus according to claim 1, wherein the protective film is formed by a plasma CVD method.

11. An electronic information device comprising an image capturing section for capturing an image of a subject, wherein the image capturing section is a solid-state image capturing apparatus according to claim 1.

12. A mounting method of a solid-state image capturing apparatus, for mounting a solid-state image capturing element including a microlens on an insulation substrate including an external lead terminal, the method comprising:
- a step of fixing the solid-state image capturing element on the insulation substrate;
- a step of connecting an external lead terminal of the insulation substrate and an electrode of the solid-state image capturing element with a wire;
- a step of forming a protective film on a surface of the insulation substrate in such a manner that exposed portions of the insulation substrate, the solid-state image capturing element and the wire are all covered with the protective film; and
- a step of positioning a transparent glass member on the insulation substrate to seal the solid-state image capturing element in such a manner to form a hollow space between a microlens of the solid-state image capturing element and the transparent glass member
- wherein the protective film is formed by a plasma CVD process prior to sealing the solid-state image capturing element with the transparent glass member.

13. A mounting method of a solid-state image capturing apparatus according to claim 12, wherein, in the step of forming the protective film, at least the solid-state image capturing element is housed in a jig that totally covers a side surface and a bottom surface of the solid-state image capturing element to perform the plasma CVD process.

14. A mounting method of a solid-state image capturing apparatus according to claim 13, wherein the plasma CVD process is performed at least in two steps by changing an inclination of the jig so that a difference remains small between a thickness of the protective film formed on a surface side of the wire and a thickness of the protective film formed on a back side of the wire.

15. A mounting method of a solid-state image capturing apparatus according to claim 12, wherein, in the plasma CVD process, tetraethy orthosilicate or ethyl ethoxy silane and $O_2$ are used as a reaction gas, and a $SiO_2$ film is formed as the protective film.

16. A mounting method of a solid-state image capturing apparatus according to claim 12, wherein, in the plasma CVD process, $SiH_4$, $NH_3$ and $N_2$ are used as a reaction gas, and a SiN film is formed as the protective film.

17. A mounting method of a solid-state image capturing apparatus according to claim 12, wherein, in the plasma CVD process, $SiH_4$, $N_2O$ and He are used as a reaction gas, and a SiON film is formed as the protective film.

18. A mounting method of a solid-state image capturing apparatus according to claim 12, wherein, in the step of forming the protective film, the plasma CVD process is performed several times by changing a component of a reaction gas so that the protective film includes a multilayer structure that includes a plurality of transparent insulation films with different refractive indexes.

19. A mounting method of a solid-state image capturing apparatus according to claim 12, wherein, in the step of forming the protective film, the plasma CVD process is performed by successively changing a component of a reaction gas so that a transparent insulation film with a successively changing refractive index is formed as the protective film.

20. A manufacturing method of a solid-state image capturing apparatus in which a solid-state image capturing element including a microlens is mounted on an insulation substrate including an external lead terminal and a transparent glass member is positioned above the insulation substrate so that the solid-state image capturing element fixed on the insulation substrate is sealed, the method comprising:
- a step of fixing the solid-state image capturing element on the insulation substrate;
- a step of connecting an external lead terminal of the insulation substrate and an electrode of the solid-state image capturing element with a wire;
- a step of forming a protective film on a surface of the insulation substrate in such a manner that exposed portions of the insulation substrate, the solid-state image capturing element and the wire are all covered with the protective film;
- wherein a refractive index of the protective film is smaller than a refractive index of a constituent material of the microlens and larger than a refractive index of air and
- a step of positioning a transparent glass member on the insulation substrate to seal the solid-state image capturing element in such a manner to form a hollow space between a microlens of the solid-state image capturing element and the transparent glass member.

* * * * *